(12) United States Patent
Choi et al.

(10) Patent No.: US 10,199,471 B2
(45) Date of Patent: Feb. 5, 2019

(54) SEMICONDUCTOR DEVICE WITH FIELD EFFECT TRANSISTORS AND METHOD OF FABRICATING THE SAME

(71) Applicant: SAMSUNG ELECTRONICS CO., LTD., Suwon-si, Gyeonggi-do (KR)

(72) Inventors: Hyoseok Choi, Hwaseong-si (KR); Hwichan Jun, Yongin-si (KR); Yoonhae Kim, Suwon-si (KR); Chulsung Kim, Seongnam-si (KR); Heungsik Park, Yongin-si (KR); Doo-Young Lee, Seoul (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 73 days.

(21) Appl. No.: 15/059,519

(22) Filed: Mar. 3, 2016

(65) Prior Publication Data
US 2016/0308016 A1 Oct. 20, 2016

(30) Foreign Application Priority Data
Apr. 16, 2015 (KR) ........................ 10-2015-0053887

(51) Int. Cl.
*H01L 29/417* (2006.01)
*H01L 29/78* (2006.01)
*H01L 29/66* (2006.01)

(52) U.S. Cl.
CPC .. *H01L 29/41791* (2013.01); *H01L 29/66545* (2013.01); *H01L 29/66795* (2013.01);
(Continued)

(58) Field of Classification Search
CPC .............. H01L 21/0228; H01L 21/048; H01L 21/28079; H01L 21/3141; H01L 21/3212; H01L 21/76889; H01L 21/762; H01L 21/76876; H01L 27/0886; H01L 27/1104; H01L 29/435; H01L 29/8615; H01L 51/0508; H01L 29/78618; H01L 29/12; H01L 29/78; H01L 29/66795; H01L 29/785; H01L 29/7848; H01L 29/7845
(Continued)

(56) References Cited

U.S. PATENT DOCUMENTS 5,081,060 A 1/1992 Kim
5,087,591 A 2/1992 Teng
(Continued)

FOREIGN PATENT DOCUMENTS

JP  H 11284072 A  10/1999
JP  2006-049808 A  2/2006
(Continued)

*Primary Examiner* — Marcos D Pizarro
*Assistant Examiner* — Antonio Crite
(74) *Attorney, Agent, or Firm* — Lee & Morse P.C.

(57) ABSTRACT

Provided is a semiconductor device including a substrate with an active pattern, a gate electrode crossing the active pattern, a source/drain region in an upper portion of the active pattern at a side of the gate electrode, the source/drain region including a recess region at an upper region thereof, a contact electrically connected to the source/drain region, the contact including a lower portion provided in the recess region, and a metal silicide layer provided at a lower region of the recess region and between the source/drain region and the contact.

18 Claims, 26 Drawing Sheets

(52) U.S. Cl.
CPC ........ *H01L 29/785* (2013.01); *H01L 29/7845* (2013.01); *H01L 29/7848* (2013.01)

(58) Field of Classification Search
USPC ............... 257/288, 350, 186, 297, 396, 377, 257/E21.006, E21.014, E21.051, E21.126, 257/E21.127, E21.267, E21.155, E21.17, 257/E21.278, E21.293, E21.304, E21.421, 257/E21.438, E21.593, 61; 438/299, 630, 438/666, 655
See application file for complete search history.

(56) References Cited

U.S. PATENT DOCUMENTS

| | | |
|---|---|---|
| 5,582,971 A | 12/1996 | Chen et al. |
| 6,136,696 A | 10/2000 | Horiba |
| 6,465,364 B2* | 10/2002 | Chien ............... H01L 21/28518 257/E21.165 |
| 6,713,388 B2 | 3/2004 | Tseng et al. |
| 8,436,404 B2 | 5/2013 | Bohr et al. |
| 8,637,348 B2 | 1/2014 | Endo et al. |
| 8,642,471 B2 | 2/2014 | Yin et al. |
| 8,643,122 B2 | 2/2014 | Alptekin et al. |
| 8,803,208 B2 | 8/2014 | Zhu et al. |
| 8,809,919 B2 | 8/2014 | Hashimi et al. |
| 9,012,326 B2* | 4/2015 | Kim .................. H01L 21/76816 257/E21.231 |
| 9,024,386 B2 | 5/2015 | Horita et al. |
| 9,166,034 B2* | 10/2015 | Nam ...................... H01L 27/228 |
| 9,257,305 B2* | 2/2016 | Lee .......................... H01L 21/36 |
| 9,287,160 B2* | 3/2016 | Nam ...................... H01L 27/228 |
| 9,312,181 B2* | 4/2016 | Choi .................. H01L 27/0886 |
| 2012/0003828 A1* | 1/2012 | Chang ................ H01L 27/1157 438/591 |
| 2013/0001555 A1* | 1/2013 | Yin .................... H01L 21/28518 257/52 |
| 2013/0049219 A1* | 2/2013 | Tsai .................. H01L 21/28518 257/774 |
| 2013/0285143 A1* | 10/2013 | Oh .................. H01L 21/823821 257/347 |
| 2014/0264480 A1* | 9/2014 | Tsao .................... H01L 23/5384 257/288 |
| 2014/0319614 A1* | 10/2014 | Paul .................. H01L 29/66795 257/365 |
| 2015/0035023 A1* | 2/2015 | Kim ...................... H01L 29/785 257/288 |
| 2015/0147861 A1* | 5/2015 | Park .................. H01L 29/66795 438/283 |
| 2015/0187945 A1* | 7/2015 | Kamineni ............. H01L 29/785 257/384 |
| 2015/0325484 A1* | 11/2015 | Lin ..................... H01L 21/3215 257/753 |
| 2015/0380305 A1* | 12/2015 | Basker ............. H01L 21/76846 257/77 |
| 2016/0056290 A1* | 2/2016 | Tsai .................... H01L 29/7848 257/192 |
| 2016/0071799 A1* | 3/2016 | Hsieh ............. H01L 21/823871 257/288 |
| 2016/0181383 A1* | 6/2016 | Huang ............. H01L 29/41758 257/757 |
| 2016/0233310 A1* | 8/2016 | Lee ...................... H01L 29/6656 |

FOREIGN PATENT DOCUMENTS

| | | |
|---|---|---|
| JP | 2013-105982 A | 5/2013 |
| KE | H 0620986 A | 1/1994 |
| KR | 10-2001-0029284 A | 4/2001 |
| KR | 10-2005-0001844 A | 1/2005 |
| KR | 10-2005-0117108 A | 12/2005 |
| KR | 10-2014-0119201 A | 10/2014 |

* cited by examiner

2000

3000

SEMICONDUCTOR DEVICE WITH FIELD EFFECT TRANSISTORS AND METHOD OF FABRICATING THE SAME

CROSS-REFERENCE TO RELATED APPLICATION

This application claims priority from Korean Patent Application No. 10-2015-0053887, filed on Apr. 16, 2015, in the Korean Intellectual Property Office, the disclosure of which is incorporated by reference herein in its entirety.

BACKGROUND

1. Field

Example embodiments relate to a semiconductor device and a method of fabricating the same, and in particular, to a semiconductor device with field effect transistors and a method of fabricating the same.

2. Description of the Related Art

Due to their small-sized, multifunctional, and/or low-cost characteristics, semiconductor devices are being esteemed as important elements in the electronic industry. The semiconductor devices may be classified into a memory device for storing data, a logic device for processing data, and a hybrid device including both of memory and logic elements. To meet the increased demand for electronic devices with fast speed and/or low power consumption, it is necessary to realize semiconductor devices with high reliability, high performance, and/or multiple functions. To satisfy these technical requirements, complexity and/or integration density of semiconductor devices are being increased.

SUMMARY

Example embodiments provide a semiconductor device, in which field effect transistors with improved electric characteristics are provided.

Other example embodiments provide a method of fabricating a semiconductor device, in which field effect transistors with improved electric characteristics are provided.

According to example embodiments, a semiconductor device may include a substrate with an active pattern, a gate electrode crossing the active pattern, a source/drain region in an upper portion of the active pattern at a side of the gate electrode, the source/drain region including a recess region at an upper region thereof, a contact electrically connected to the source/drain region, the contact including a lower portion in the recess region, and a metal silicide layer at a lower region of the recess region and between the source/drain region and the contact.

In example embodiments, the source/drain region may have a top surface higher than a bottom surface of the contact.

In example embodiments, a bottom surface of the contact may be spaced apart from a bottom surface of the recess region with the metal silicide layer interposed therebetween.

In example embodiments, the semiconductor device may further include a spacer in an upper region of the recess region and interposed between the source/drain region and the contact.

In example embodiments, a bottom surface of the spacer may be positioned at a higher level than a bottom surface of the contact.

In example embodiments, a bottom surface of the spacer may be positioned at substantially the same level as a bottom surface of the contact.

In example embodiments, a top surface of the metal silicide layer may be in contact with a bottom surface of the contact and with a bottom surface of the spacer.

In example embodiments, the lower portion of the contact may include a first portion adjacent to an upper region of the recess region and a second portion adjacent to the lower region of the recess region, and the first portion may have a width greater than that of the second portion.

In example embodiments, the contact may include a conductive pillar and a barrier layer enclosing the conductive pillar.

In example embodiments, the semiconductor device may further include device isolation layers on the substrate to define the active pattern. The source/drain region and the upper portion of the active pattern may protrude upwardly between the device isolation layers.

In example embodiments, the semiconductor device may further include, gate spacers on sidewalls of the gate electrode, and a gate dielectric layer between the gate electrode and the gate spacers and between the gate electrode and the active pattern. The gate spacers and the gate dielectric layer may extend along the gate electrode.

In example embodiments, the semiconductor device may further include an interlayered insulating layer covering the active pattern, the source/drain region and the gate electrode. The contact may be connected to the source/drain region through the interlayered insulating layer.

According to other example embodiments, a semiconductor device may include a substrate, device isolation layers provided on the substrate to define an active pattern, a gate electrode crossing the active pattern, a source/drain region in an upper portion of the active pattern at a side of the gate electrode, and a contact electrically connected to the source/drain region. The source/drain region may include a recess region at an upper region thereof, the contact may include a lower portion in the recess region, and when viewed in a direction crossing the gate electrode, a sidewall of the recess region adjacent to a bottom surface of the contact may have a staircase profile.

In example embodiments, the semiconductor device may further include a metal silicide layer at a lower region of the recess region and between the source/drain region and the contact.

In example embodiments, the semiconductor device may further include a spacer provided at an upper region of the recess region and between the source/drain region and the contact. The contact and the spacer may be arranged to trace the same profile as the staircase profile of the recess region.

In example embodiments, the lower portion of the contact may include a first portion adjacent to an upper region of the recess region and a second portion adjacent to a lower region of the recess region, and the first portion and the second portion may have the same profile as the staircase profile of the recess region.

According to still other example embodiments, a semiconductor device may include a substrate with an active pattern, a source/drain region in a portion of the active pattern, the source/drain region defining a recess region at an upper region thereof, a contact electrically connected to the source/drain region, and a spacer covering a sidewall of the contact. The contact may include a lower portion in the recess region, and the spacer may include a lower portion between the source/drain region and the lower portion of the contact.

In example embodiments, a bottom surface of the spacer may be positioned at a higher level than a bottom surface of the recess region.

In example embodiments, the semiconductor device may further include an interlayered insulating layer covering the active pattern and the source/drain region. The contact may penetrate the interlayered insulating layer, and an upper portion of the spacer may be interposed between the interlayered insulating layer and an upper portion of the contact.

In example embodiments, a width of a portion of the recess region contacting a bottom of the spacer may be larger than a width of a lowermost surface of the recess.

According to yet other example embodiments, a semiconductor device includes a substrate with an active pattern, a gate electrode crossing the active pattern, a source/drain region in an upper portion of the active pattern at a side of the gate electrode, a recess region at an upper region of the source/drain region, the recess region having two different depths, and a contact electrically connected to the source/drain region, the contact extending into the recess region.

In example embodiments, the device may further include a spacer extending into a portion of the recess region, the contact extending inside the recess region to a larger depth than the spacer.

In example embodiments, a width of a portion of the recess region contacting a bottom of the spacer may be larger than a width of a lowermost surface of the recess.

In example embodiments, the device may further include a metal silicide layer in the recess region, the metal silicide layer electrically connecting the source/drain region to the contact.

In example embodiments, the two different depths of the recess region may define a staircase profile, the contact extending to a larger depth of the two different depths.

According to still other example embodiments, a method of fabricating a semiconductor device may include forming device isolation layers on a substrate to define an active pattern, forming a gate electrode crossing the active pattern, forming a source/drain region in an upper portion of the active pattern at a side of the gate electrode, forming an interlayered insulating layer to cover the active pattern, the source/drain region and the gate electrode, forming a contact hole to penetrate the interlayered insulating layer, expose the source/drain region, and form a recess region in an upper region of the source/drain region, and forming a contact to fill the contact hole and the recess region.

In example embodiments, the method may further include forming a metal silicide layer at a lower region of the recess region, before the forming of the contact.

In example embodiments, before the forming of the contact, the method may further include forming a spacer layer to partially fill the contact hole, and anisotropically etching the spacer layer to form a spacer covering a sidewall of the contact hole.

In example embodiments, the anisotropic etching of the spacer layer may comprises etching an upper region of the source/drain region exposed by the contact hole to expand the recess region toward the substrate.

In example embodiments, when viewed in a direction crossing the gate electrode, the anisotropic etching of the spacer layer may be performed in such a way that the recess region has a staircase sidewall.

In example embodiments, the method may further include performing a pre-cleaning process on the contact hole with the spacer, before the forming of the contact. The pre-cleaning process may be performed to remove the spacer and expose the sidewall of the contact hole.

In example embodiments, the forming of the contact may include sequentially forming a barrier layer and a conductive layer to fill the contact hole and the recess region.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
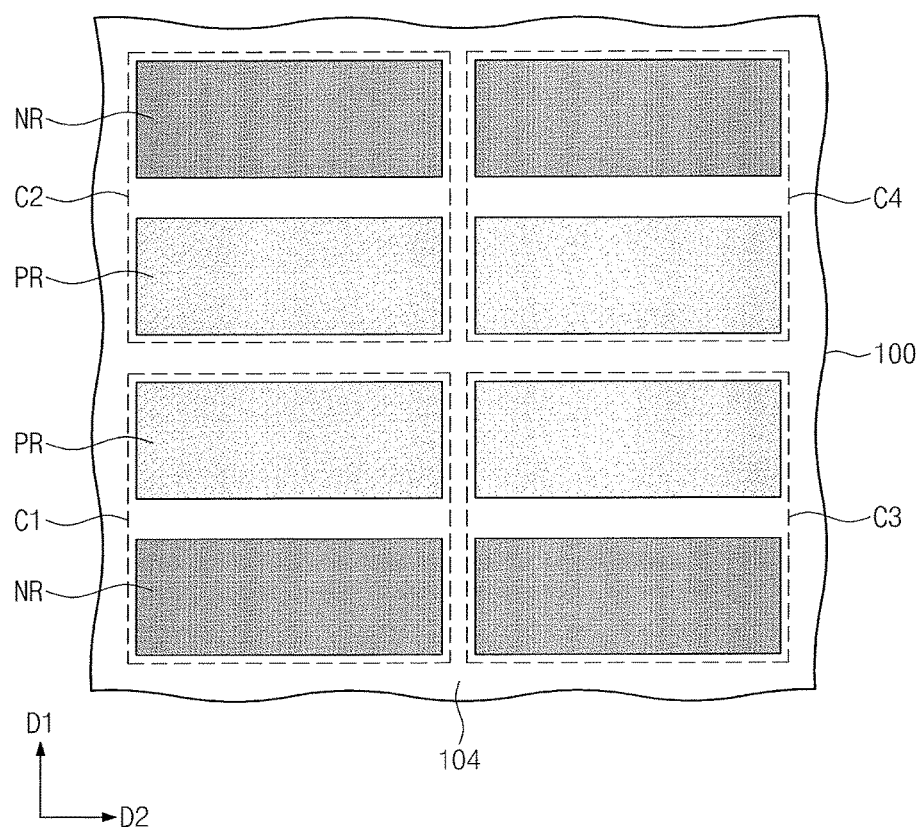
FIG. 1 is a schematic plan view illustrating a semiconductor device according to example embodiments.

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of skill in the art. In the drawings, the thicknesses of layers and regions may be exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on," etc.). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of skill in the art. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic plan view illustrating a semiconductor device according to example embodiments.

Referring to FIG. 1, a semiconductor device according to example embodiments may include a plurality of logic cells, e.g., first through fourth logic cells C1, C2, C3, and C4, provided on a substrate 100. Each of the plurality of logic cells, e.g., each of the first through fourth logic cells C1, C2, C3, and C4, may include a plurality of transistors. As an example, the semiconductor device may include a first logic cell C1, a second logic cell C2 spaced apart from the first logic cell C1 in a first direction D1, a third logic cell C3 spaced apart from the first logic cell C1 in a second direction D2 crossing the first direction DE and a fourth logic cell C4 spaced apart from the second logic cell C2 in the second direction D2. Each of the plurality of logic cells, e.g., each of the first through fourth logic cells C1, C2, C3, and C4, may include active regions separated apart from each other by first device isolation layers 104. For example, each of the first through fourth logic cells C1, C2, C3, and C4 may include a PMOSFET region PR and an NMOSFET region NR separated apart from each other by the device isolation layers 104.

In example embodiments, the PMOSFET region PR and the NMOSFET region NR may be spaced apart from each other in the first direction D1. The PMOSFET region PR of the first logic cell C1 may be adjacent to the PMOSFET region PR of the second logic cell C2 in the first direction D1. In the following description, the term "logic cell" may refer to a unit circuit configured to perform a single logical operation. Further, the number of the logic cells may be variously changed from that illustrated in the drawing.

Figure 2:
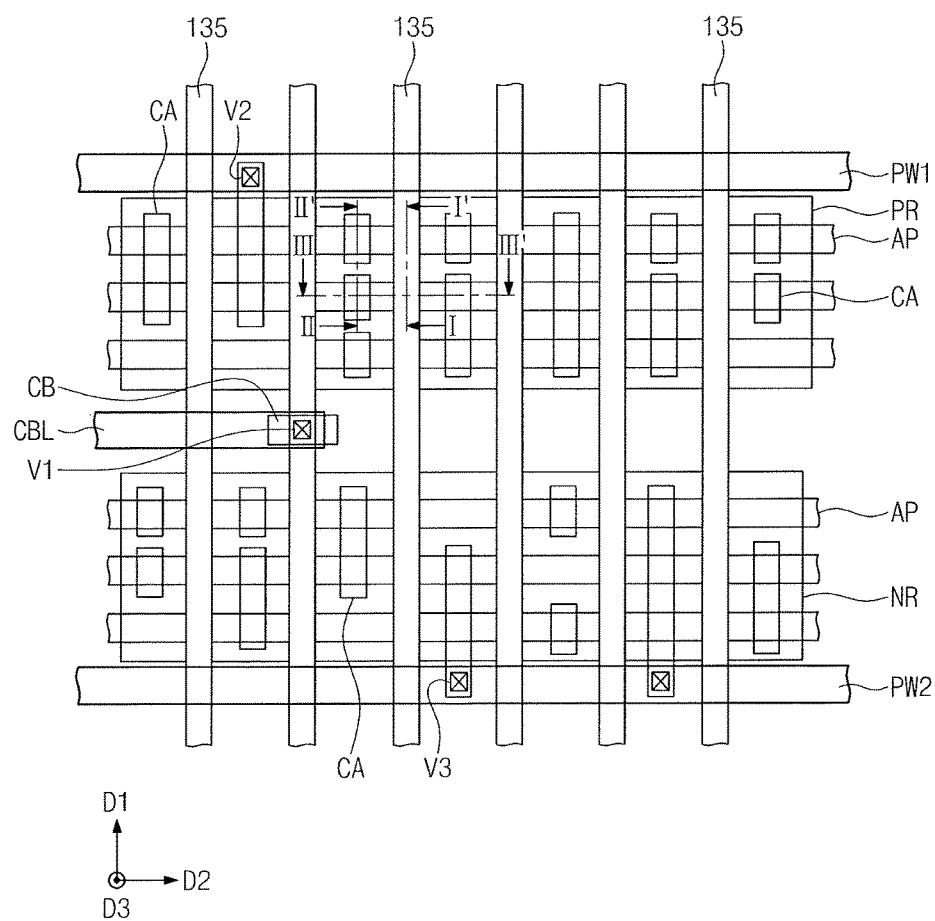
FIG. 2 is a plan view illustrating a portion of a semiconductor device according to example embodiments.
Figure 3A:
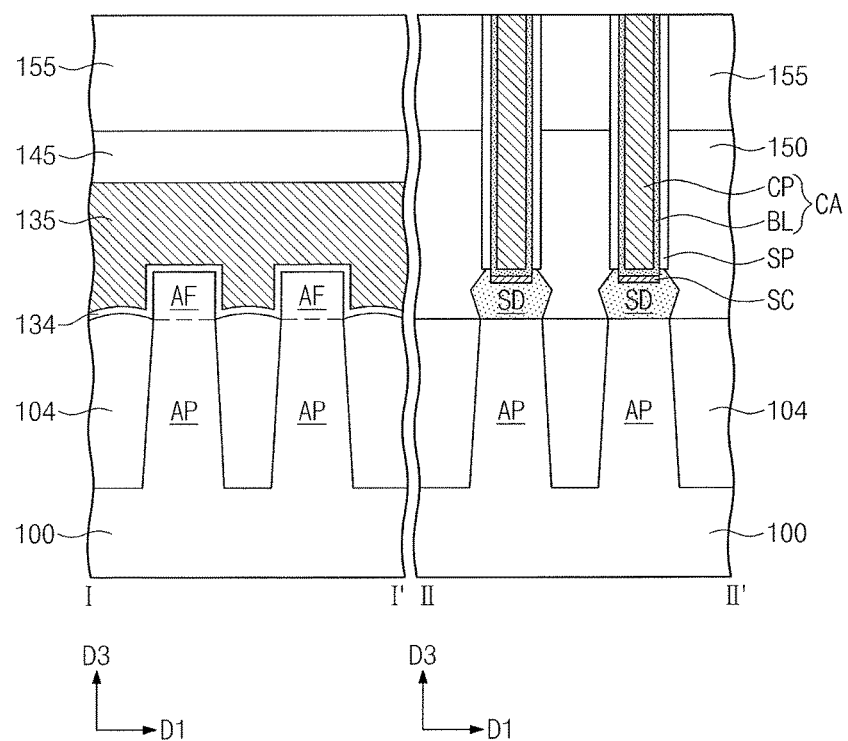
FIG. 3A is a sectional view illustrating vertical sections taken along lines I-I' and II-IP of FIG. 2.
Figure 3B:
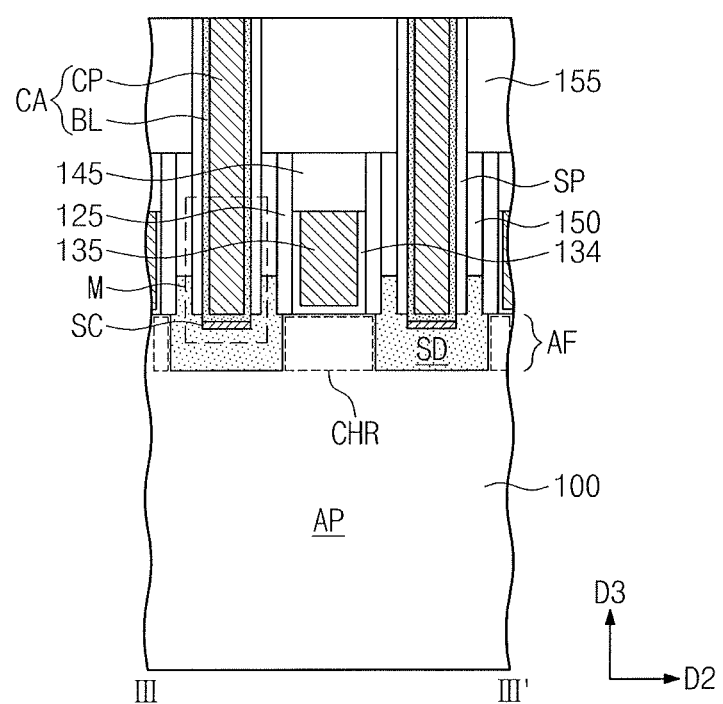
FIG. 3B is a sectional view illustrating a vertical section taken along line III-III' of FIG. 2.

FIG. 2 is a plan view illustrating a portion of a semiconductor device according to example embodiments. For example, FIG. 2 may be a plan view illustrating the first logic cell C1 of FIG. 1. Hereinafter, various embodiments will be described with reference to the first logic cell C1 of FIG. 1, but other logic cells may have substantially the same or similar structure as that of the first logic cell C1. FIG. 3A is a sectional view illustrating vertical sections taken along lines I-I' and II-IP of FIG. 2. FIG. 3B is a sectional view illustrating a vertical section taken along line of FIG. 2.

Referring to FIGS. 2, 3A, and 3B, the device isolation layers 104 may be provided on the substrate 100 to define the PMOSFET region PR and the NMOSFET region NR. The device isolation layers 104 may be formed in an upper portion of the substrate 100. The device isolation layers 104 may be formed of or include an insulating material (e.g., silicon oxide).

The PMOSFET and NMOSFET regions PR and NR may be spaced apart from each other, in the first direction D1 parallel to a top surface of the substrate 100, with the device isolation layers 104 interposed therebetween. Although each of the PMOSFET and NMOSFET regions PR and NR is shown to be a single region, it may be formed to include a plurality of regions which are separated apart from each other by the device isolation layers 104.

A plurality of active patterns AP may be provided on the PMOSFET and NMOSFET regions PR and NR to extend in the second direction D2 crossing the first direction D1. The active patterns AP may be arranged, e.g., spaced apart from each other, along the first direction D1. The active patterns AP may be formed to have a first conductivity type. To define the active patterns AP, the device isolation layers 104 may be provided at both, e.g., opposite, sides of each of the active patterns AP. Although FIG. 2 illustrates the number of the active patterns AP provided on each of the PMOSFET and NMOSFET regions PR and NR as three, example embodiments are not limited thereto.

The active patterns AP may include active fins AF protruding between the device isolation layers 104 (FIG. 3A). For example, each of the active fins AF may be a portion of the active pattern AP, which protrudes in a direction normal to the top surface of the substrate 100, e.g., in a third direction D3. Each of the active fins AF may include source/drain regions SD and a channel region CHR interposed between the source/drain regions SD (FIG. 3B).

In example embodiments, gate electrodes 135 may be formed on the substrate 100 to cross the active patterns AP. The gate electrodes 135 may be overlapped with the channel regions CHR of the active fins AF, respectively, when viewed in a plan view. In other words, the gate electrodes 135 may be provided to cross the active fins AF protruding between the device isolation layers 104, and each of them may be a line-shaped structure extending in the first direction D1.

Gate spacers 125 may be provided on both, e.g., opposite, sidewalls of each of the gate electrodes 135. The gate spacers 125 may extend along the gate electrodes 135 or parallel to the first direction D1. Each of the gate spacers 125 may have a top surface that is positioned at a higher level than those of the gate electrodes 135 relative to the substrate 100. Furthermore, the top surface of each of the gate spacers 125 may be coplanar with that of a first interlayered insulating layer 150, which will be described below. The gate spacers 125 may be formed of or include at least one of, e.g., SiO$_2$, SiCN, SiCON, and SiN. In other example embodiments, each of the gate spacers 125 may be a multi-layered structure including at least one of, e.g., SiO$_2$, SiCN, SiCON, and SiN.

Gate dielectric layers 134 may be provided between the gate electrodes 135 and the substrate 100, and between the gate electrodes 135 and the gate spacers 125. Each of the gate dielectric layers 134 may extend along a bottom surface of the gate electrode 135. The gate dielectric layers 134 may be disposed on the channel regions CHRS. For example, the gate dielectric layers 134 may cover top and side surfaces of the active fins AF. As illustrated in FIG. 3A, each of the gate dielectric layers 134 may include a portion horizontally extending from the active fins AF and partially covering top surfaces of the device isolation layers 104. In certain embodiments, the gate dielectric layer 134 may be provided to expose at least a portion of the top surface of the device isolation layer 104. The exposed portion of the device isolation layer 104, which is not covered with the gate dielectric layer 134, may be covered by the first interlayered insulating layer 150.

The gate dielectric layers 134 may include at least one of high-k dielectric materials. As an example, the gate dielectric layers 134 may be formed of or include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

Gate capping layers 145 may be provided on the gate electrodes 135, respectively. The gate capping layers 145 may extend along the gate electrodes 135 or parallel to the first direction D1. The gate capping layers 145 may be formed of or include a material having an etch selectivity with respect to first and second interlayered insulating layers 150 and 155, which will be described below. For example, the gate capping layers 145 may be formed of or include at least one of SiON, SiCN, SiCON, and SiN.

The active fins AF may include the source/drain regions SD provided at both sides of each of the gate electrodes 135. The source/drain regions SD may be epitaxial patterns epitaxially grown from the active patterns AP. When viewed in a sectional view, top surfaces of the source/drain regions SD may be positioned at a level that is substantially equal to or higher than those of the channel regions CHR relative to the substrate 100.

The source/drain regions SD may include a semiconductor element different from those contained in the substrate 100. As an example, the source/drain regions SD may be formed of or include a semiconductor material having a lattice constant different from, i.e., greater or smaller than, that of the substrate 100. This may make it possible for the source/drain regions SD to exert a compressive or tensile stress on the channel regions CHR. As an example, in the case where the substrate 100 is a silicon wafer, the source/drain regions SD may be formed of or include a silicon-germanium (e-SiGe) or germanium layer. In this case, the source/drain regions SD may exert a compressive stress on the channel regions CHR, e.g., for PMOS field effect transistors. As another example, in the case where the substrate 100 is a silicon wafer, the source/drain regions SD may be formed of or include silicon carbide (SiC). In this case, the source/drain regions SD may exert a tensile stress on the channel regions CHR, e.g., for NMOS field effect transistors. Since the source/drain regions SD exert the compressive or tensile stress on the channel regions CHR, it is possible to increase mobility of carriers in the channel regions CHR, when the field effect transistors are operated. The source/drain regions SD may have a conductivity type (hereinafter, a second conductivity type) that is different from that of the active pattern AP.

The first interlayered insulating layer 150 may be provided on the substrate 100. The first interlayered insulating layer 150 may cover the gate spacers 125 and the source/drain regions SD. The first interlayered insulating layer 150 may have a top surface that is substantially coplanar with those of the gate capping layers 145. The second interlayered insulating layer 155 may be provided on the first interlayered insulating layer 150 to cover the gate capping layers 145.

In addition, contacts CA may be provided at both sides of each of the gate electrodes 135 to penetrate the first and second interlayered insulating layers 150 and 155 and be electrically connected to the source/drain regions SD. Each of the contact CA may be connected to a corresponding one of the source/drain regions SD or may be connected in common to a plurality of the source/drain regions SD, but example embodiments are not limited thereto. Each of the contacts CA may include a conductive pillar CP and a barrier layer BL enclosing the conductive pillar CP. The barrier layer BL may be provided to cover side and bottom surfaces of the conductive pillar CP. The conductive pillar CP may be formed of or include a metal material (e.g., tungsten). The barrier layer BL may be formed of or include at least one of metal nitrides or a double layer of Ti/TiN.

Metal silicide layers SC may be respectively interposed between the source/drain regions SD and the contacts CA. In other words, the contacts CA may be electrically connected to the source/drain regions SD through the metal silicide layers SC. The metal silicide layers SC may include at least one of metal-silicide materials (e.g., titanium silicide, tantalum silicide, or tungsten silicide).

Spacers SP may be interposed between the contacts CA and the first interlayered insulating layer 150. Each of the spacers SP may include a portion interposed between a corresponding one of the contacts CA and a pair of the gate electrodes 135 adjacent thereto. The spacer SP may be provided to enclose a sidewall of the contact CA. The spacer SP may include a lower portion interposed between the contact CA and the source/drain region SD. The spacer SP may be formed of or include at least one of, e.g., $SiO_2$, SiCN, SiCON, and SiN.

A gate contact CB and a conductive line CBL may be provided on at least one of the gate electrodes 135 (FIG. 2). A first via V1 may be provided between the gate contact CB and the conductive line CBL. The conductive line CBL may be electrically connected to the at least one of the gate electrodes 135 through the first via V1 and the gate contact CB, and may be used to apply an electric signal to the at least one of the gate electrodes 135.

The first logic cell C1 may include a first wire PW1 provided outside the PMOSFET region PR and a second wire PW2 provided outside the NMOSFET region NR. In example embodiments, the first wire PW1 on the PMOSFET region PR may serve as a pathway for delivering a drain voltage (Vdd) or a power voltage. The second wire PW2 on the NMOSFET region NR may serve as a pathway for delivering a source voltage (Vss) or a ground voltage.

Referring back to FIGS. 1 and 2, the first and second wires PW1 and PW2 may extend in the second direction D2 and may be shared by a plurality of the logic cells that are disposed adjacent to each other in the second direction D2. As an example, the first wire PW1 may be shared by the first logic cell C1 and the third logic cell C3. Also, the first wire PW1 may be shared by the PMOSFET region PR of the first logic cell C1 and the PMOSFET region PR of the second logic cell C2.

In example embodiments, a second via V2 may be provided on at least one of the contacts CA. Accordingly, the source/drain region SD connected to the at least one of the contacts CA may be electrically connected to the first wire PW1 through the at least one of the contacts CA and the second via V2. Similarly, the source/drain region SD on the NMOSFET region NR may also be electrically connected to the second wire PW2 through another one of the contacts CA and a third via V3.

FIGS. 4A through 4F are enlarged sectional views of the region M of FIG. 3B. Hereinafter, some examples of the contact CA and the source/drain region SD according to various example embodiments will be described in more detail with reference to FIGS. 4A through 4F. In the following description, an element previously described with reference to FIGS. 2, 3A, and 3B may be identified by a similar or identical reference number without repeating an overlapping description thereof, for the sake of brevity.

Figure 4A:
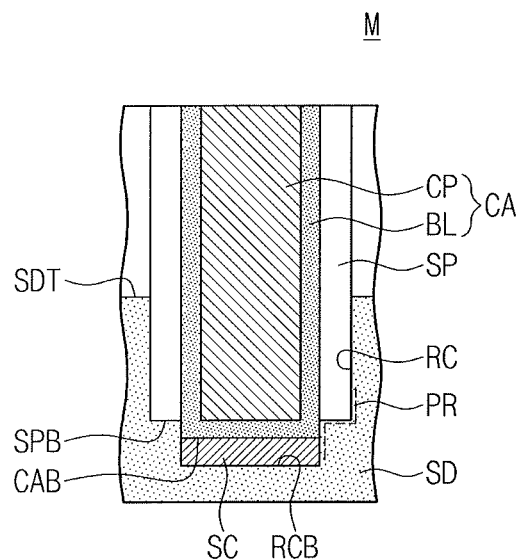
FIGS. 4A through 4F are enlarged sectional views illustrating a region M of FIG. 3B.

Referring to a first example shown in FIG. 4A, the source/drain region SD may include a recess region RC formed at an upper region thereof. The contact CA may include a lower portion provided in the recess region RC. A top surface SDT of the source/drain region SD may be higher than a bottom surface CAB of the contact CA. The contact CA may include the conductive pillar CP and the barrier layer BL.

The metal silicide layer SC may be interposed between the contact CA and the source/drain region SD. The metal silicide layer SC may be provided to fill a lower region of the recess region RC. In other words, the bottom surface CAB of the contact CA may be spaced apart from a bottom surface RCB of the recess region RC, in a vertical direction, by the metal silicide layer SC interposed therebetween. Side and bottom surfaces of the metal silicide layer SC may be in direct contact with the source/drain region SD.

The spacer SP may be interposed between the contact CA and the source/drain region SD to enclose the sidewall of the contact CA. For example, the spacer SP may include a lower portion which is provide at an upper region of the recess region RC and between the contact CA and the source/drain region SD. Accordingly, a bottom surface SPB of the spacer SP may be positioned at a lower level than the top surface SDT of the source/drain region SD. Here, the bottom surface SPB of the spacer SP may be positioned at a higher level than the bottom surface CAB of the contact CA.

In a sectional view taken along the second direction D2, the sidewall PR of the recess region RC adjacent to the bottom surface CAB of the contact CA may be provided to have a staircase profile, e.g., stepped, profile. That is, as illustrated in FIG. 4A, the recess region RC may include a bottom surface of a lowermost level, i.e., bottom surface RCB of the recess region RC, and an elevated-bottom surface at a higher level than the bottom surface RCB relatively to the substrate 100, such that the bottom of the recess region RC includes two different depths. Each of the two different depths of the recess region RC includes a different width to define the staircase profile, such that the bottom surface RCB may have a smaller width along the second direction D2 than a width of the elevated-bottom surface, i.e., a portion of the recess region RC supporting the bottom surface SPB of the spacer SP, as will be discussed in more detail below with references to widths W1 and W2 in FIG. 4B. Due to the staircase profile of the recess region RC, the contact CA may include a portion protruding downward from, e.g., relative to, the spacer SP. Accordingly, the sidewall PR of the recess region RC may be in contact with a lower sidewall of the spacer SP, the bottom surface SPB of the spacer SP, and a lower sidewall of the contact CA. As such, the contact plug and the source/drain region may have an improved electrical connection through the lower bottom surface RCB of the recess region RC, while the contact plug is electrically insulated from the gate electrode by the spacer SP. The afore-described profile of the sidewall PR of the recess region RC can be more clearly found, when viewed in a section crossing a center of the active fin AF and parallel to the second direction D2.

In the semiconductor device according to the present embodiment, the spacer SP may be extended to the recess region RC of the source/drain region SD along the sidewall of the contact CA, and this makes it possible to prevent a short circuit from being formed between the contact CA and the gate electrode 135. Furthermore, the upper region of the source/drain region SD may enclose the lower portion of the contact CA and the metal silicide layer SC, and thus, it is possible to reduce electric resistance between the contact CA and the source/drain region SD.

Referring to a second example shown in FIG. 4B, the spacer SP may not be provided, unlike the structure described with reference to FIG. 4A. Accordingly, a lower sidewall of the contact CA may be in direct contact with the source/drain region SD. The bottom surface CAB of the contact CA may be spaced apart from the bottom surface RCB of the recess region RC with the metal silicide layer SC interposed therebetween.

A lower portion of the contact CA provided in the recess region RC may include a first portion P1 adjacent to the upper region of the recess region RC and a second portion P2 adjacent to a lower region of the recess region RC. In a sectional view taken along the second direction D2, the second portion P2 may have a first width W1 and the first portion P1 may have a second width W2. Here, the second width W2 may be larger than the first width W1. In other words, the lower portion of the contact CA may have a width decreasing in a direction toward the substrate 100.

In a sectional view taken along the second direction D2, the sidewall PR of the recess region RC adjacent to the bottom surface CAB of the contact CA may be provided to have a staircase profile. The staircase profile of the sidewall PR of the recess region RC may allow the second portion P2 to have a width smaller than that of the first portion P1.

Referring to a third example shown in FIG. 4C, the bottom surface SPB of the spacer SP may be positioned at substantially the same level as the bottom surface CAB of the contact CA, unlike the structure described with reference to FIG. 4A. In a sectional view taken along the second direction D2, the sidewall PR of the recess region RC adjacent to the bottom surface CAB of the contact CA may be provided to have a staircase profile. The staircase profile of the sidewall PR of the recess region RC may allow the metal silicide layer SC to have a width smaller than a sum of widths of the contact CA and the spacer SP. Accordingly, the sidewall PR of the recess region RC may be in contact with a lower sidewall of the spacer SP, the bottom surface SPB of the spacer SP, and a sidewall of the metal silicide layer SC, e.g., without contacting the barrier layer BL of the contact CA.

Figure 4B:
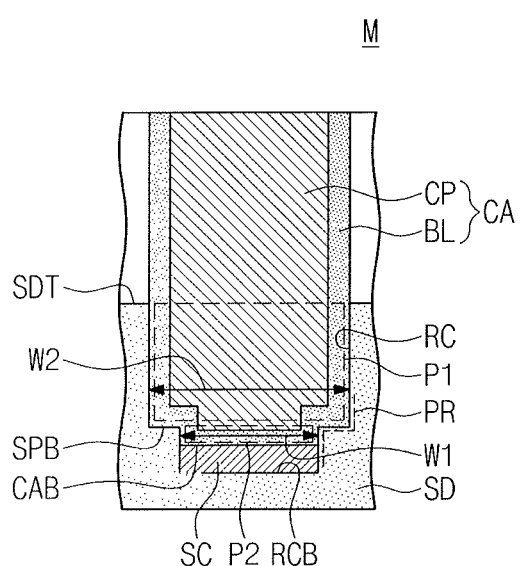
Figure 4C:
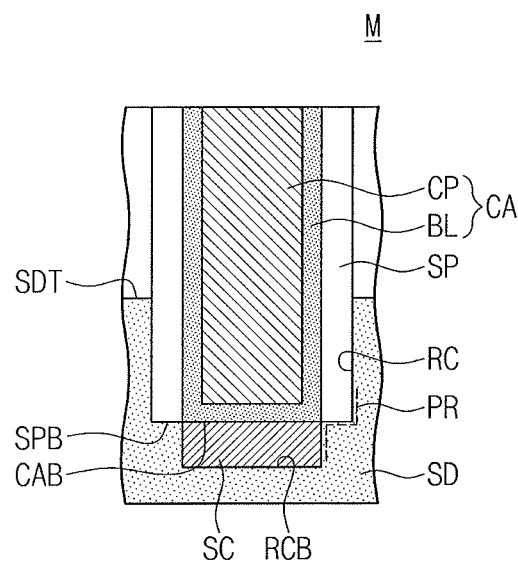
Figure 4D:
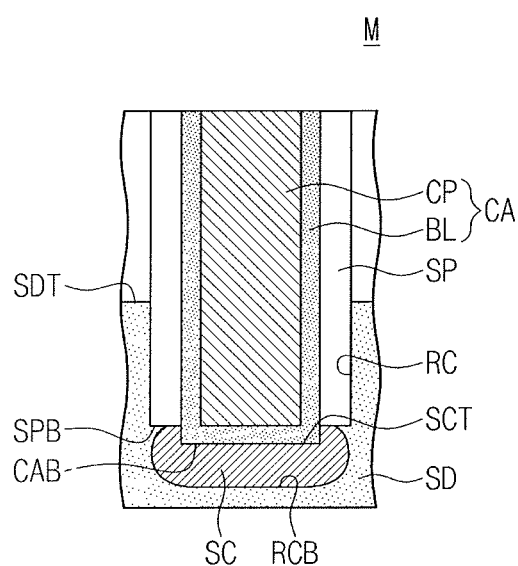

Referring to a fourth example shown in FIG. 4D, the metal silicide layer SC may be provided to have an expanded structure, compared with the metal silicide layer SC of FIG. 4A. Accordingly, a top surface SCT of the metal silicide layer SC may be in contact with not only the bottom surface CAB of the contact CA but also with the bottom surface SPB of the spacer SP. The metal silicide layer SC may be provided to fill a lower region of the recess region RC and enclose a bottom of the contact CA.

Figure 4E:
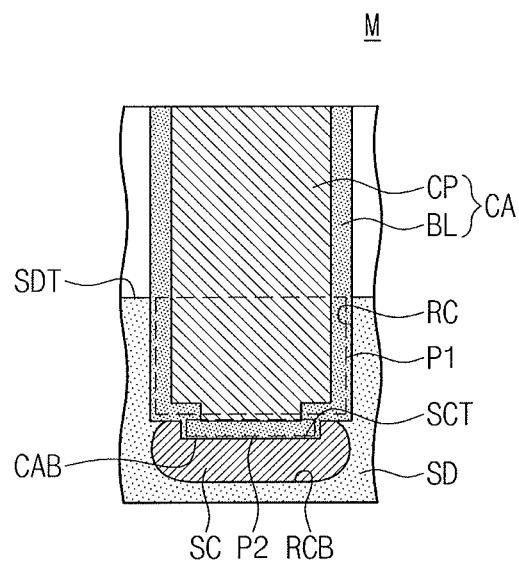

Referring to a fifth example shown in FIG. 4E, the metal silicide layer SC may be provided to have an expanded structure, compared with the metal silicide layer SC of FIG. 4B. Accordingly, the top surface SCT of the metal silicide layer SC may be in direct contact with side and bottom surfaces of the second portion P2. In addition, the top surface SCT of the metal silicide layer SC may be in contact with a portion of a bottom surface of the first portion P1.

Figure 4F:
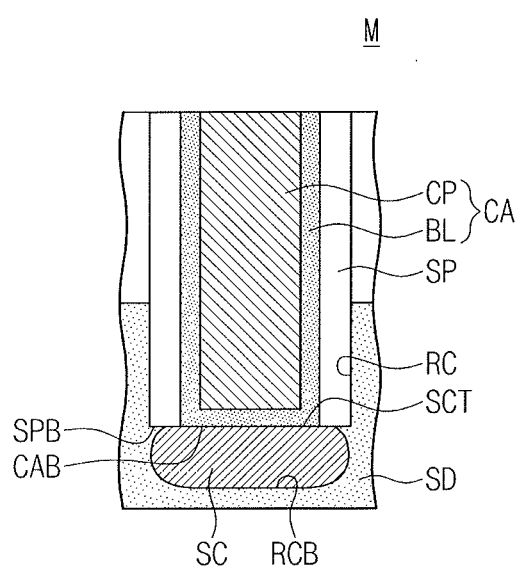

Referring to a sixth example shown in FIG. 4F, the metal silicide layer SC may be provided to have an expanded structure, compared with the metal silicide layer SC of FIG. 4C. Accordingly, the top surface SCT of the metal silicide layer SC may be in contact with both of the bottom surface SPB of the spacer SP and the bottom surface CAB of the contact CA.

FIGS. 5A through 12A and 5B through 12B are sectional views illustrating stages in a method of fabricating a semiconductor device, according to example embodiments. In detail, FIGS. 5A through 12A are sectional views, each illustrating vertical sections taken along lines I-I' and II-II' of FIG. 2, and FIGS. 5B through 12B are sectional views illustrating a vertical section taken along line of FIG. 2.

Figure 5A:
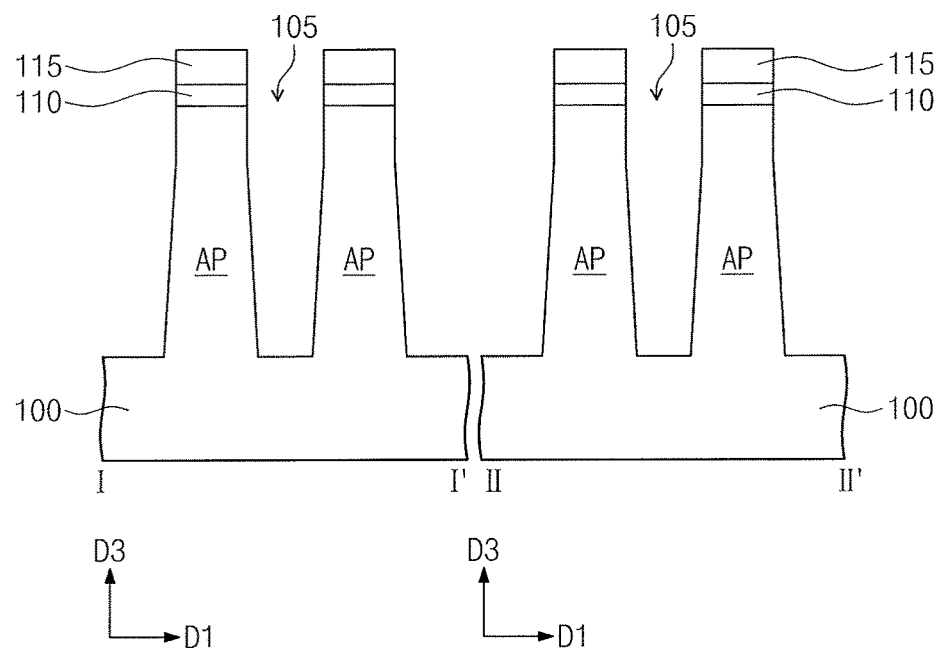
FIG. 5A-5B, FIG. 6A-6B, FIG. 7A-7B, FIG. 8A-8B, FIG. 9A-9B, FIG. 10A-10B, FIG. 11A-11B, and FIG. 12A-12B are sectional views illustrating stages in a method of fabricating a semiconductor device, according to example of embodiments.
Figure 5B:
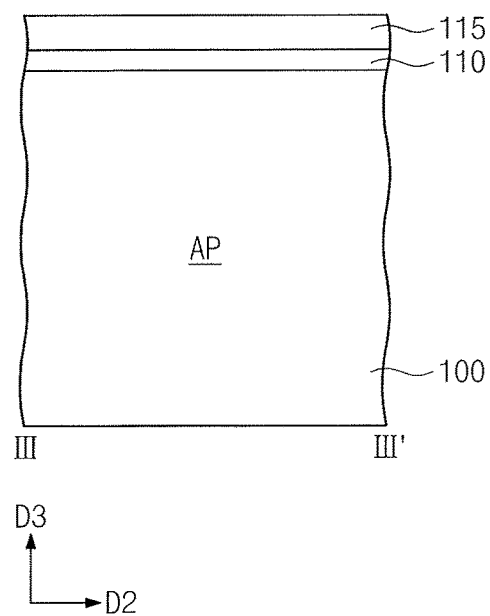

Referring to FIGS. 2, 5A, and 5B, the substrate 100 may be patterned to form device isolation trenches 105 defining the active patterns AP. The substrate 100 may be or may include a semiconductor substrate, which is made of at least one of silicon, germanium, silicon-germanium, or semiconductor compound. The active patterns AP may be doped to have the first conductivity type.

The formation of the device isolation trenches 105 may include forming mask patterns on the substrate 100 and anisotropically etching the substrate 100 using the mask patterns as an etch mask. Each of the mask patterns may include a first mask pattern 110 and a second mask pattern 115, which are sequentially stacked on the substrate 100 and are formed to have an etch selectivity with respect to each other. Each of the device isolation trenches 105 may be formed to have an aspect ratio of at least 5. In example embodiments, each of the device isolation trenches 105 may be formed to have a downward tapered shape. Accordingly, each of the active patterns AP may be formed to have an upward tapered shape.

Figure 6A:
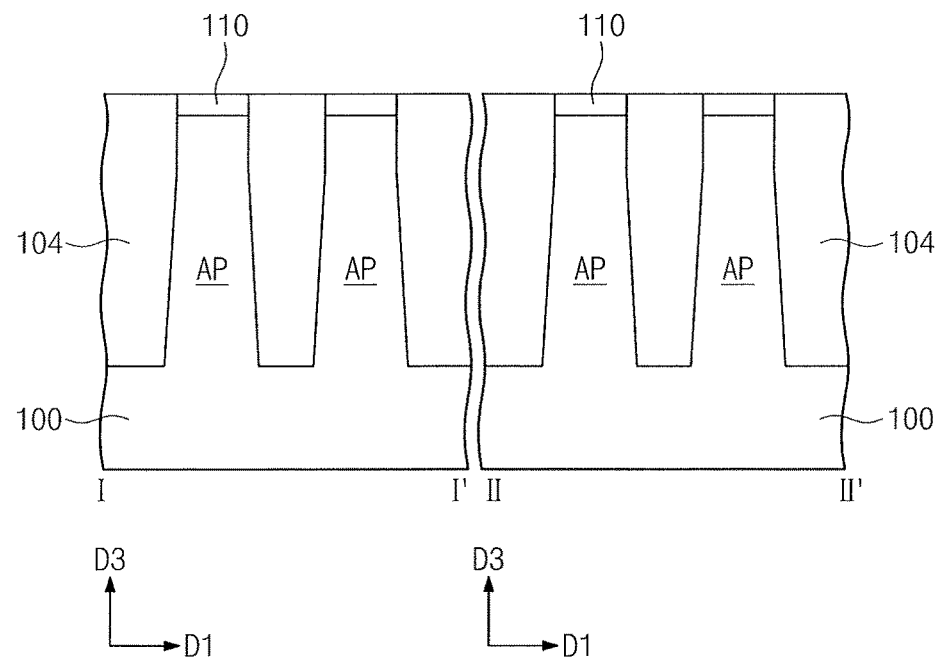
Figure 6B:
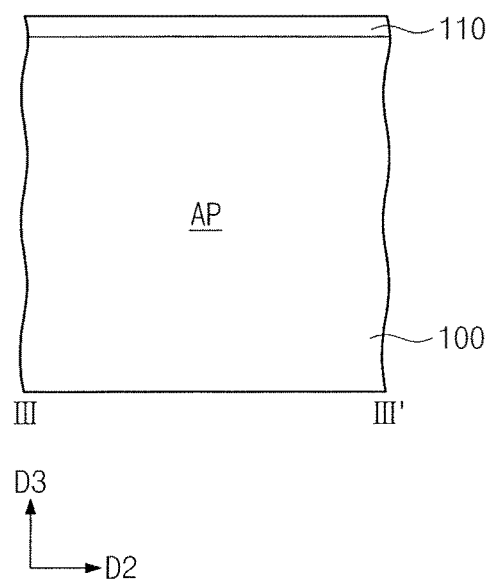

Referring to FIGS. 2, 6A, and 6B, device isolation layers 104 may be formed to fill the device isolation trenches 105. The formation of the device isolation layers 104 may include forming an insulating layer (e.g., a silicon oxide layer) to fill the device isolation trenches 105 and planarizing the insulating layer to expose the top surface of the first mask pattern 110. As a result, the device isolation layers 104 may be locally formed in the device isolation trenches 105, respectively.

Figure 7A:
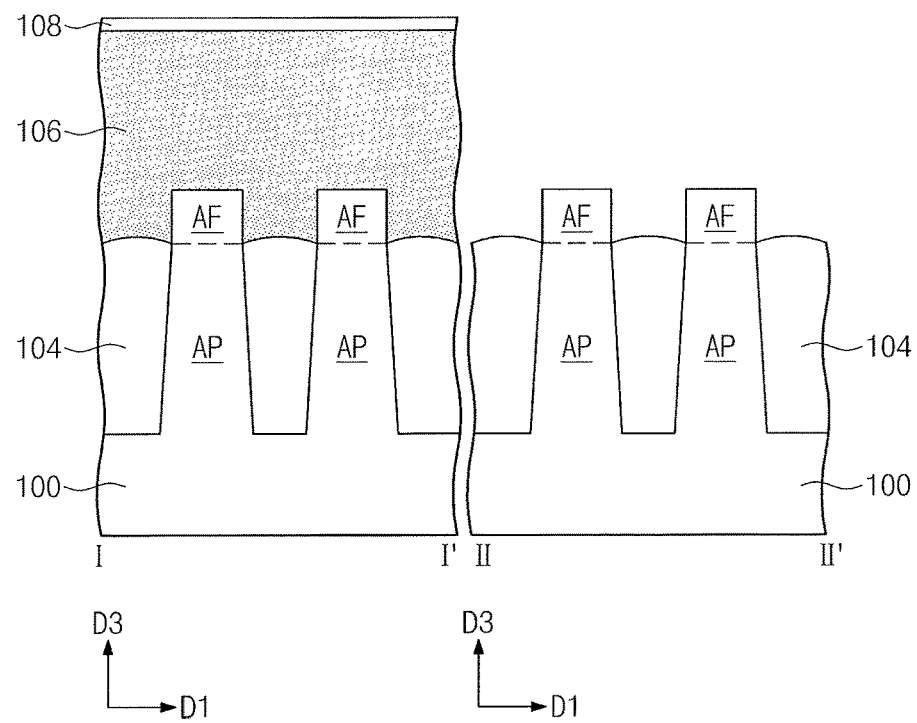
Figure 7B:
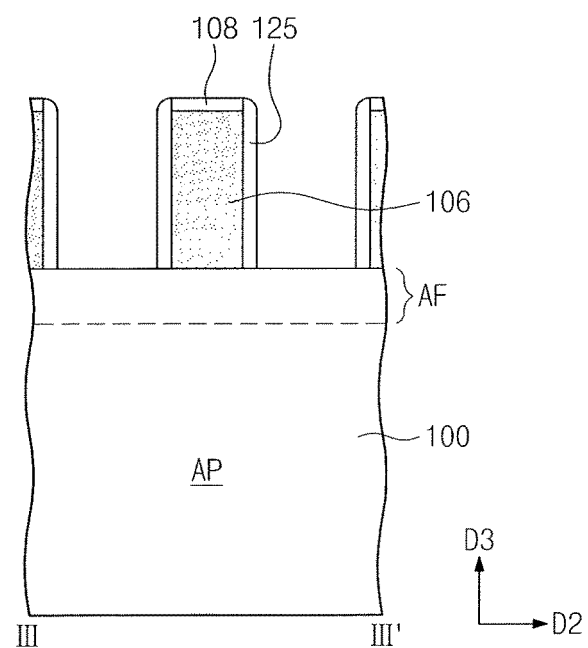

Referring to FIGS. 2, 7A, and 7B, upper portions (hereinafter, active fins AF) of the active patterns AP may be exposed. The exposing of the active fins AF may include vertically etching or recessing upper portions of the device isolation layers 104 using a wet etching process. The etching of the device isolation layers 104 may be performed using an etch recipe having an etch selectivity with respect to the active patterns AP. The first mask pattern 110 may also be removed when the device isolation layers 104 are etched, and thus, top surfaces of the active fins AF may be exposed.

Sacrificial gate patterns 106 and gate mask patterns 108 may be formed on the active fins AF. Each of the sacrificial gate patterns 106 and the gate mask patterns 108 may be a line- or bar-shaped structure crossing the active fins AF and extending parallel to the first direction D1. For example, the sacrificial gate patterns 106 and the gate mask patterns 108 may be formed by sequentially forming a sacrificial gate layer and a gate mask layer on the active fins AF and the device isolation layers 104, and patterning the sacrificial gate layer and the gate mask layer. The sacrificial gate layer may include, e.g., a poly-silicon layer. The gate mask layer may be formed of or include, e.g., a silicon nitride layer or a silicon oxynitride layer.

The gate spacers 125 may be formed on both sidewalls of each of the sacrificial gate patterns 106. The formation of the gate spacers 125 may include conformally forming a spacer layer on the substrate 100 provided with the sacrificial gate patterns 106, and then, performing an anisotropic etching process on the spacer layer. The spacer layer may be formed of, e.g., $SiO_2$, SiCN, SiCON, and SiN. In other example embodiments, the spacer layer may be formed to have a multi-layered structure including at least one of, e.g., $SiO_2$, SiCN, SiCON, and SiN.

Figure 8A:
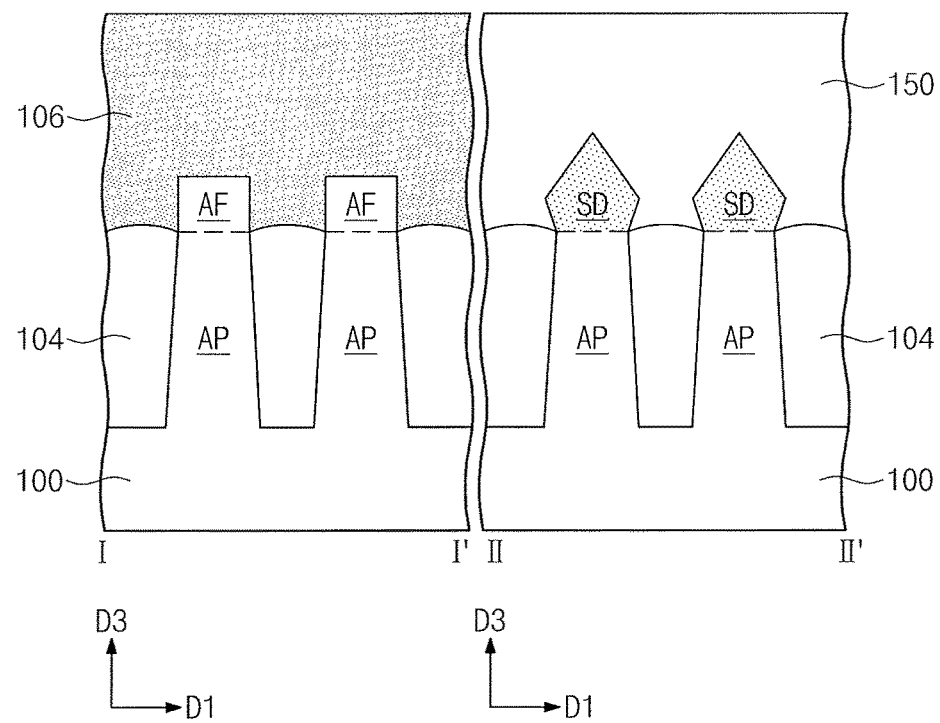
Figure 8B:
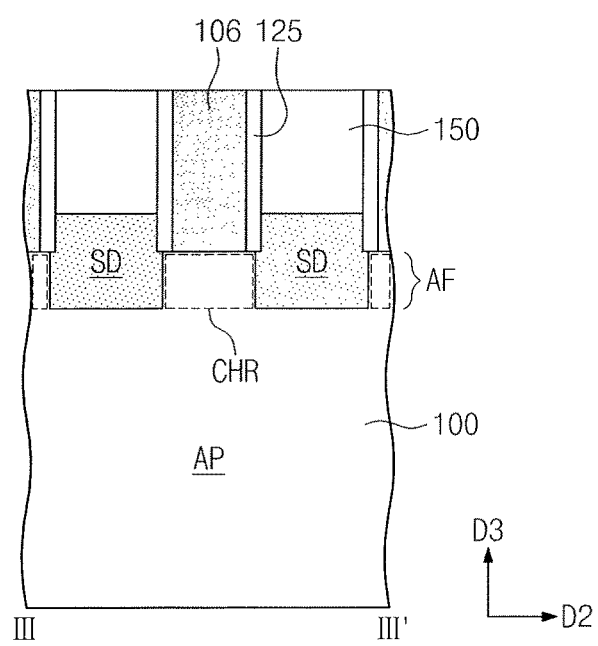

Referring to FIGS. 2, 8A, and 8B, the source/drain regions SD may be formed at both sides of each of the sacrificial gate patterns 106. For example, the source/drain regions SD may be formed by a selective epitaxial growth process using the substrate 100 as a seed layer. The selective epitaxial growth process may include, e.g., a chemical vapor deposition (CVD) process or a molecular beam epitaxy (MBE) process. The formation of the source/drain regions SD may include selectively etching the active fins AF using the gate mask patterns 108 and the gate spacers 125 as an etch mask. Thereafter, the source/drain regions SD may be grown using the exposed tops of the active patterns AP as a seed layer. As a result of the formation of the source/drain regions SD, the channel regions CHR may be defined between the source/drain regions SD.

The top surfaces of the source/drain regions SD may be higher than those of the channel regions CHR. Furthermore, the top surfaces of the source/drain regions SD may be provided to have a non-vanishing curvature, e.g., the top surfaces of the source/drain regions SD may have an upward convex shape.

The source/drain regions SD may be formed to include a semiconductor element different from those contained in the substrate 100. As an example, the source/drain regions SD may be formed of or include a semiconductor material having a lattice constant different from, e.g., greater or smaller than, the substrate 100. This may make it possible for the source/drain regions SD to exert a compressive or tensile stress on the channel regions CHR. As an example, in the case where the substrate 100 is a silicon wafer, the source/drain regions SD may be formed of or include a silicon-germanium (e-SiGe) or germanium layer. In this case, the source/drain regions SD may exert a compressive stress on the channel regions CHR, e.g., for PMOS field effect transistors. As another example, in the case where the substrate 100 is a silicon wafer, the source/drain regions SD may be formed of or include silicon carbide (SiC). In this case, the source/drain regions SD may exert a tensile stress on the channel regions CHR, e.g., for NMOS field effect transistors. Since the source/drain regions SD exert the compressive or tensile stress on the channel regions CHR, it is possible to increase mobility of carriers in the channel regions CHR, when the field effect transistors are operated.

The source/drain regions SD may be doped to have a different conductivity type (e.g., the second conductivity type) from the first conductivity type of the active patterns AP. In example embodiments, the source/drain regions SD may be in-situ doped during the formation of the source/drain regions SD. In other example embodiments, the doping of the source/drain regions SD may be performed using an ion implantation process, after the formation of the source/drain regions SD.

Thereafter, the first interlayered insulating layer 150 may be formed to cover the source/drain regions SD. In detail, the formation of the first interlayered insulating layer 150 may include depositing an insulating layer on the substrate 100 to cover the sacrificial gate patterns 106 and the gate mask patterns 108. As an example, the first interlayered insulating layer 150 may include a silicon oxide layer and may be formed by a flowable chemical vapor deposition (FCVD) process.

Thereafter, the first interlayered insulating layer 150 may be planarized to expose top surfaces of the sacrificial gate patterns 106. The planarization of the first interlayered insulating layer 150 may be performed using an etch-back or chemical mechanical polishing (CMP) process. As a result of the planarization process, the gate mask patterns 108 may be removed to expose the top surfaces of the sacrificial gate patterns 106. In other words, the planarization process may be performed to remove upper portions of the gate spacers 125. Accordingly, the first interlayered insulating layer 150 may have a top surface that is coplanar with the top surfaces of the sacrificial gate patterns 106 and the gate spacers 125.

Figure 9A:
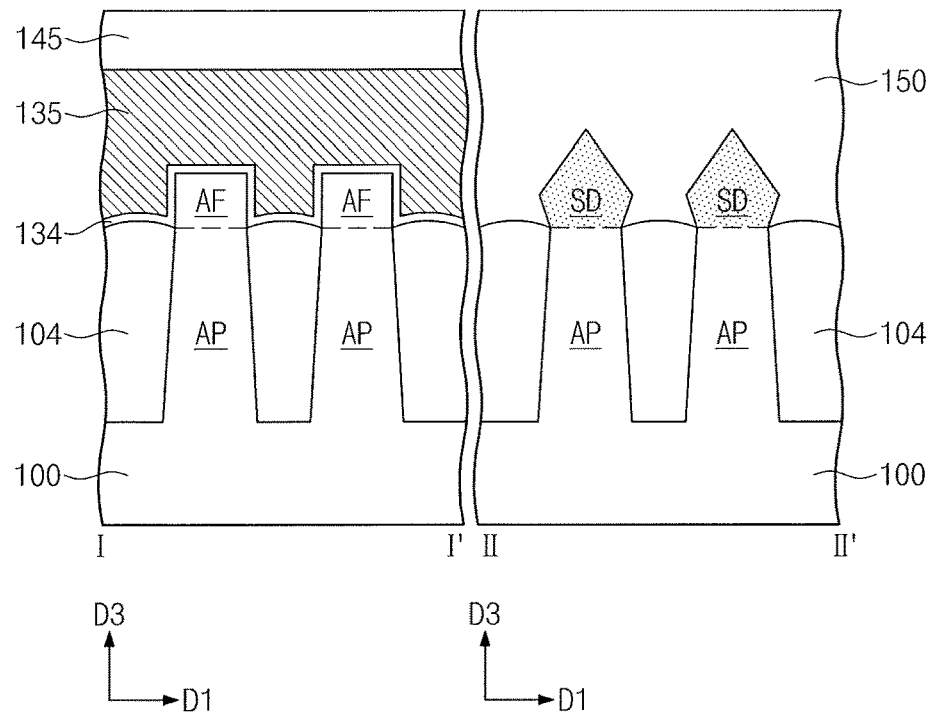
Figure 9B:
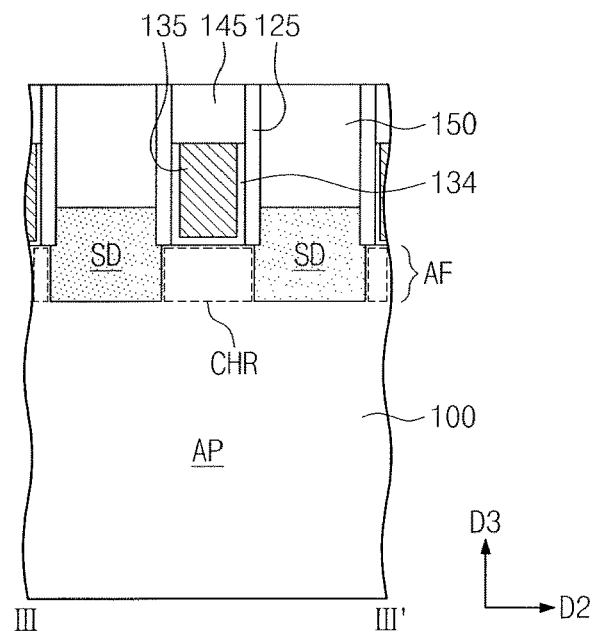

Referring to FIGS. 2, 9A, and 9B, the sacrificial gate patterns 106 may be replaced with gate structures. Each of the gate structures may include the gate dielectric layer 134, the gate electrode 135, and the gate capping layer 145.

The sacrificial gate patterns 106 may be removed to form gate trenches. The gate trenches may be formed by an etching process of selectively removing the sacrificial gate patterns 106. The gate trenches may be formed to expose the channel regions CHR of the active fins AF.

The gate dielectric layer 134 and the gate electrode 135 may be formed in each of the gate trenches. The gate dielectric layer 134 may be conformally formed to have a thickness that is too small to completely fill the gate trench. The gate dielectric layer 134 may be formed by an atomic layer deposition (ALD) process or a chemical oxidation process. The gate dielectric layer 134 may include at least one of high-k dielectric materials. As an example, the gate dielectric layer 134 may be formed of or include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

Thereafter, a gate electrode layer may be formed to fill the gate trenches 130 provided with the gate dielectric layer 134, and then, the gate electrode layer and the gate dielectric layer 134 may be planarized to expose the top surface of the first interlayered insulating layer 150. As a result, the gate dielectric layer 134 and the gate electrode 135 may be locally formed in each of the gate trenches. The gate dielectric layer 134 and the gate electrode 135 may extend in the first direction D1. In example embodiments, the gate electrode layer may be formed of or include at least one of conductive metal nitrides (e.g., titanium nitride or tantalum nitride) and metals (e.g., titanium, tantalum, tungsten, copper, or aluminum). The gate electrode layer may be formed by a deposition process (e.g., a CVD process or a sputtering process). The planarization of the gate electrode layer and the gate dielectric layer 134 may include a CMP process.

Next, upper portions of the gate electrodes 135 may be recessed and then the gate capping layers 145 may be formed on the gate electrodes 135, respectively. For example, the removal of the upper portion of the gate electrodes 135 may be performed by a selective etching process. As a result of the etching process, the gate electrodes 135 may have top surfaces lower than that of the first interlayered insulating layer 150. In example embodiments, after the recessing of the upper portions of the gate electrodes 135, a portion of the gate dielectric layer 134 positioned above the gate electrode 135 may be removed. As a result, the gate dielectric layer 134 may be provided between the gate electrode 135 and the active fin AF and between the gate electrode 135 and the gate spacers 125.

The gate capping layers 145 may be formed to cover the recessed top surfaces of the gate electrodes 135, respectively. The gate capping layers 145 may be formed to completely fill the recessed regions of the gate electrodes 135. The gate capping layers 145 may be formed of or include a material having an etch selectivity with respect to not only the first interlayered insulating layer 150 but also the second interlayered insulating layer 155, which will be formed in a subsequent process 155. As an example, the gate capping layers 145 may be formed of or include at least one of SiON, SiCN, SiCON, and SiN. The gate capping layers 145 may be formed by an atomic layer deposition (ALD) process, a plasma-enhanced chemical vapor deposition (PECVD) process, or a high-density plasma chemical vapor deposition (HDP-CVD) process.

Figure 10A:
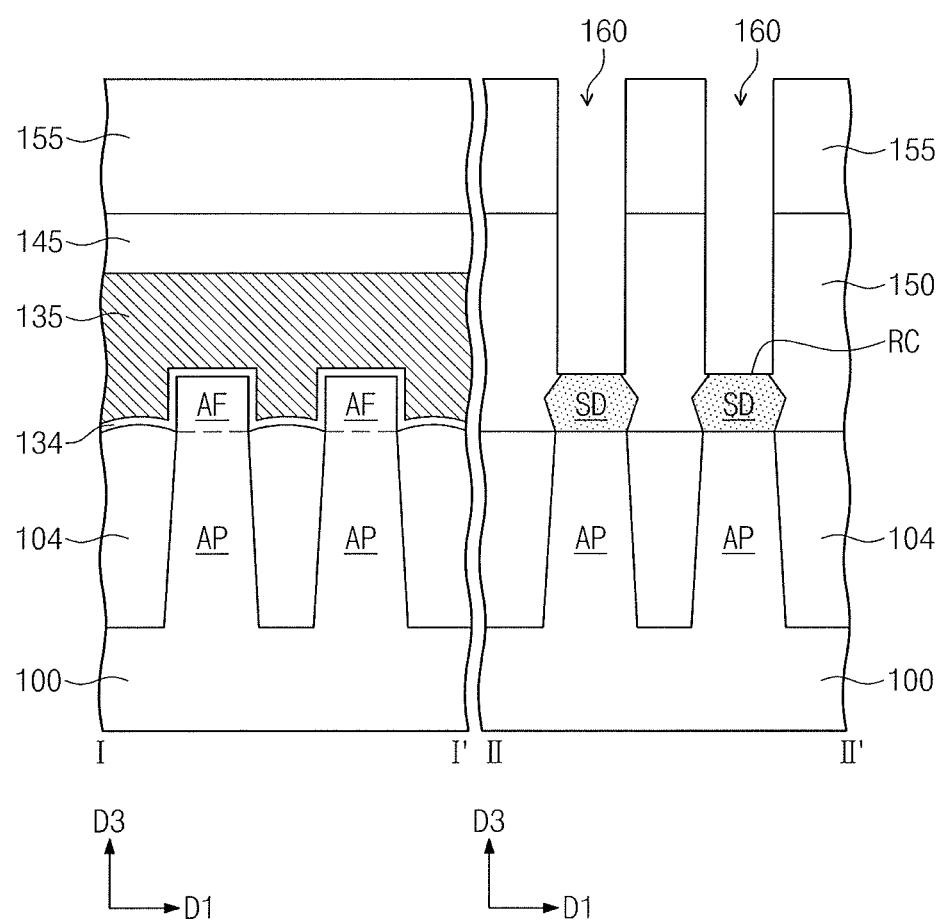
Figure 10B:
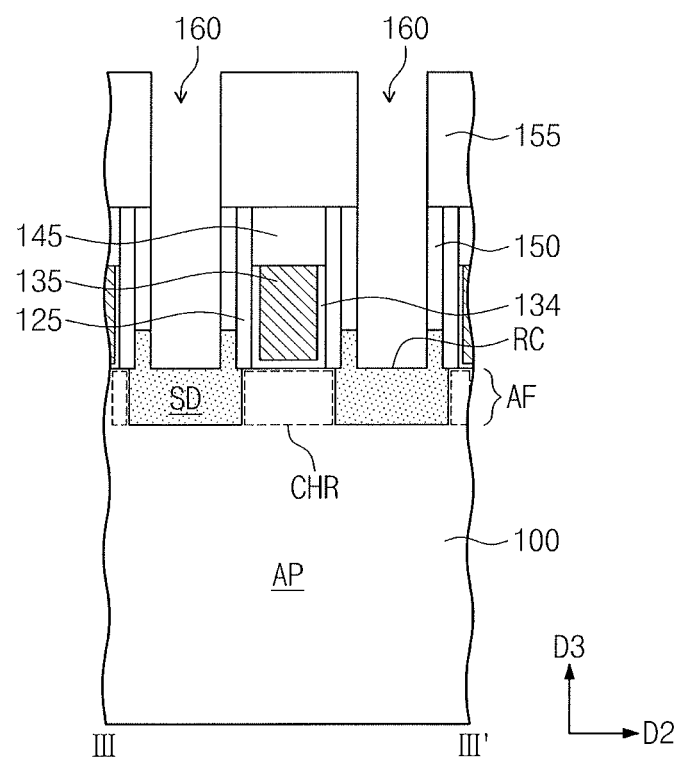

Referring to FIGS. 2, 10A, and 10B, the second interlayered insulating layer 155 may be formed on the first interlayered insulating layer 150 and the gate capping layer 145. The second interlayered insulating layer 155 may include a silicon oxide layer or a low-k oxide layer. The low-k oxide layer may include, e.g., a carbon-doped silicon oxide layer (e.g., SiCOH). The second interlayered insulating layer 155 may be formed by a CVD process.

Next, contact holes 160 may be formed to penetrate the second interlayered insulating layer 155 and the first interlayered insulating layer 150 to expose the source/drain regions SD. As an example, the contact holes 160 may be self-align contact holes, which are self-aligned with respect to the gate capping layers 145 and the gate spacers 125. For example, the formation of the contact holes 160 may include forming a photoresist pattern on the second interlayered insulating layer 155 to define positions and shapes of the contact holes 160, and performing an anisotropic etching process using the photoresist pattern as an etch mask. When viewed in a plan view, the photoresist pattern may be formed to have openings superimposed on the contact holes 160, respectively.

The upper regions of the source/drain regions SD may be partially etched, when the contact holes 160 are formed. Accordingly, the recess regions RC may be formed at the upper regions of the source/drain regions SD. For example, as illustrated in FIG. 10B, each of the recess regions RC may be a cavity within a corresponding source/drain regions SD extending from a top surface of the source/drain region SD toward the substrate 100, e.g., sidewalls of each of the recess regions RC may be coplanar with sidewalls of the contact holes 160 and may be completely surrounded by an upper portion of the source/drain regions SD.

Figure 11A:
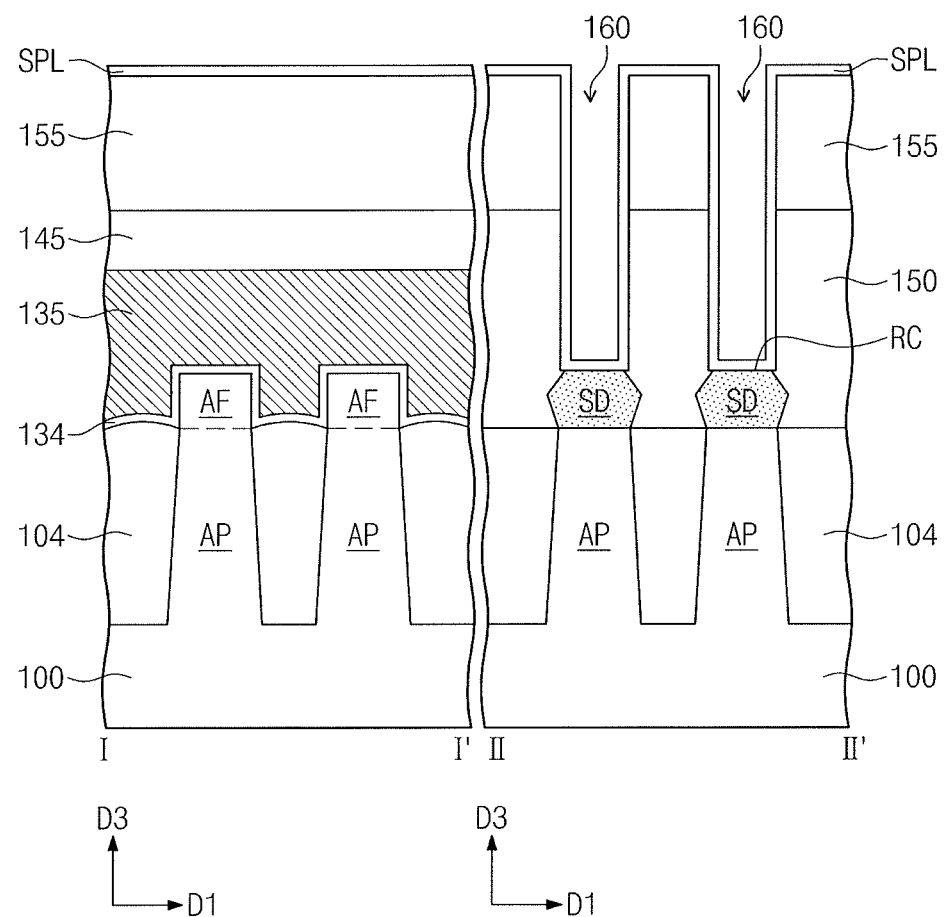
Figure 11B:
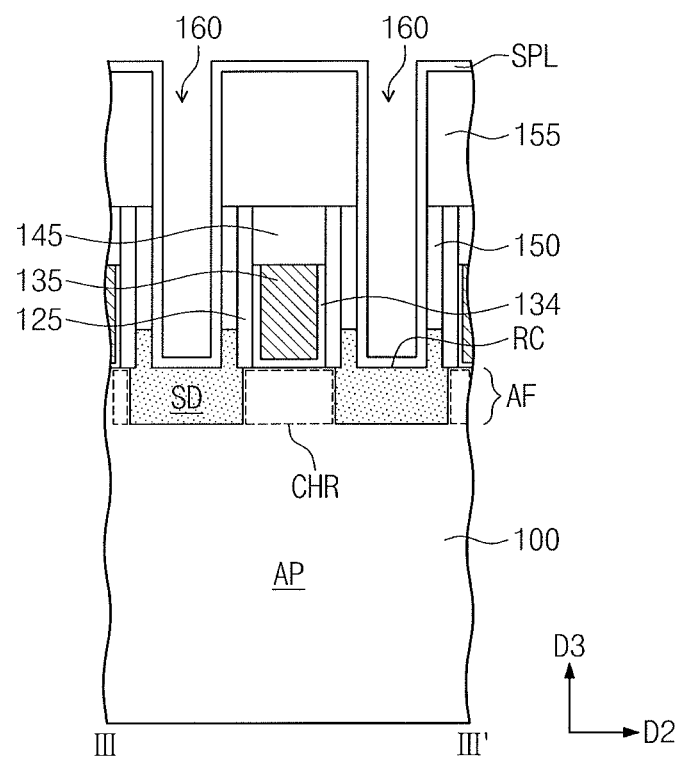

Referring to FIGS. 2, 11A, and 11B, a spacer layer SPL may be formed in the contact holes 160. The spacer layer SPL may be conformally formed to have a thickness that is too small to completely fill the contact holes 160. The spacer layer SPL may be formed of or include at least one of, e.g., $SiO_2$, SiCN, SiCON, and SiN.

Figure 12A:
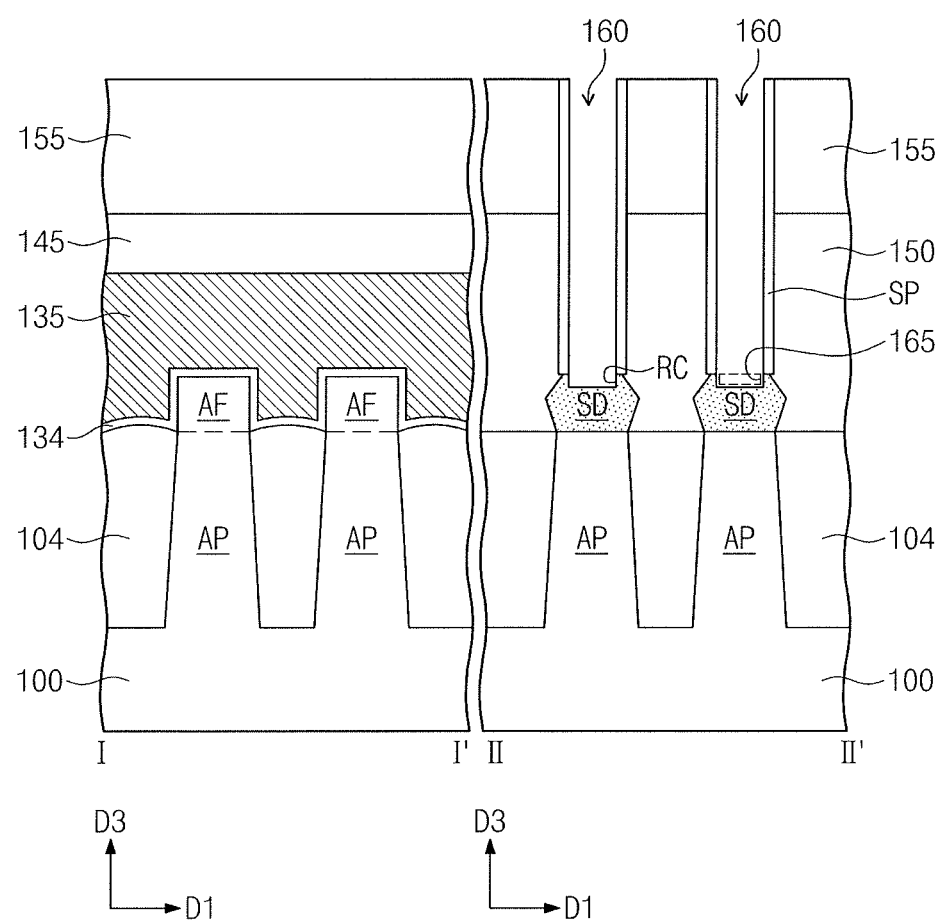
Figure 12B:
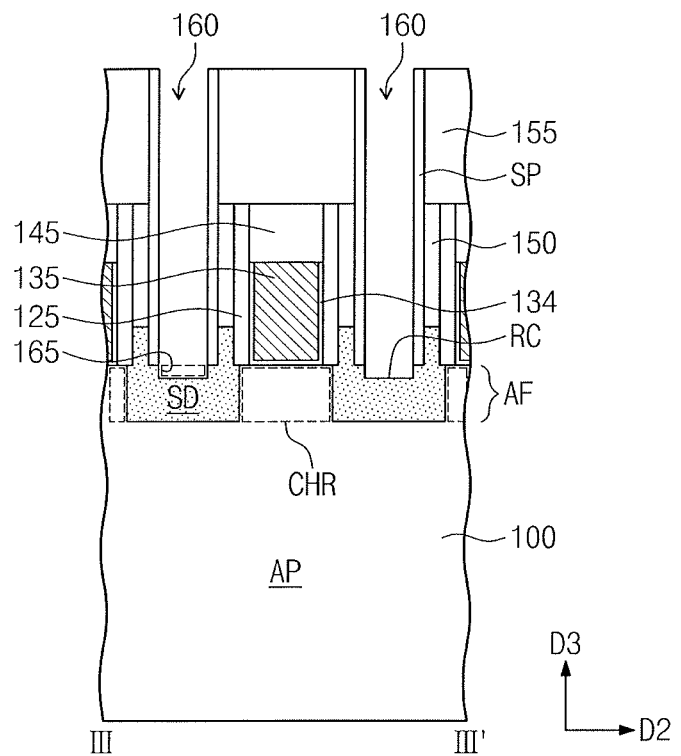

Referring to FIGS. 2, 12A, and 12B, the spacer layer SPL may be anisotropically etched to form the spacers SP covering sidewalls of the contact holes 160. As a result of the formation of the spacers SP, the upper regions of the source/drain regions SD, i.e., the bottom surfaces of the recess regions RC, may be again exposed. Here, the exposed upper regions of the source/drain regions SD may be over-etched by the anisotropic etching process. Accordingly, during etching of the spacer layer SPL on the bottom of the recess regions RC, expanded holes 165 may be formed below the contact holes 160 to extend toward the substrate 100. The expanded holes 165 may be connected to the contact holes 160. As a result of the formation of the expanded holes 165, the recess regions RC may be further extended toward the substrate. In a sectional view taken along the second direction D2, the sidewalls of the recess regions RC may have a staircase profile, due to the expanded holes 165.

Referring back to FIGS. 2, 3A, 3B, and 4A, the metal silicide layer SC may be formed in a lower region of each of the recess regions RC. For example, a metal layer may be formed in the upper regions of the source/drain regions SD exposed by the contact holes 160, e.g., the metal layer may be formed in a lower portion of the expanded hole 165. A thermal treatment process may be performed on the metal layer to form a metal-silicide layer. Thereafter, a strip process and a pre-cleaning process may be performed to form the metal silicide layer SC filling a lower portion of the recess region RC. The metal silicide layer SC may include at least one of, e.g., titanium silicide, tantalum silicide, and tungsten silicide.

Thereafter, the contacts CA may be formed in the contact holes 160 to be in contact with the spacers SP and the metal silicide layers SC. Each of the contacts CA may include the conductive pillar CP and the barrier layer BL enclosing the conductive pillar CP. For example, the barrier layer BL may be formed to partially fill the contact holes 160. Next, a conductive layer may be formed to fill the contact holes 160, and then, a planarization process may be performed on the conductive layer to expose a top surface of the second interlayered insulating layer 155. The barrier layer BL may include a metal nitride layer (e.g., Ti/TiN), and the conductive layer may include a metallic material (e.g., tungsten).

In other example embodiments, the metal silicide layers SC may be formed to have an enlarged shape, e.g., as shown in FIG. 4D. The shape of the metal silicide layer SC may be variously changed depending on a kind of metal in use and a process condition of the thermal treatment step.

Figure 13A:
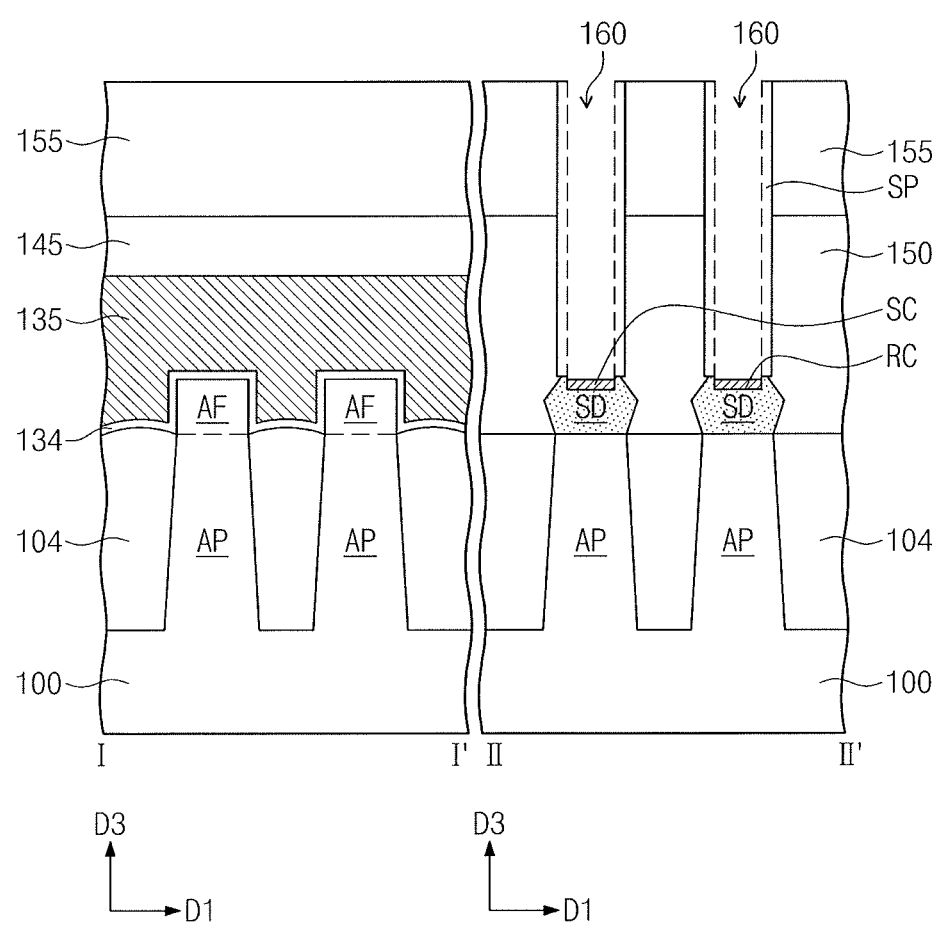
FIGS. 13A and 13B are sectional views illustrating a method of fabricating a semiconductor device, according to other example embodiments.
Figure 13B:
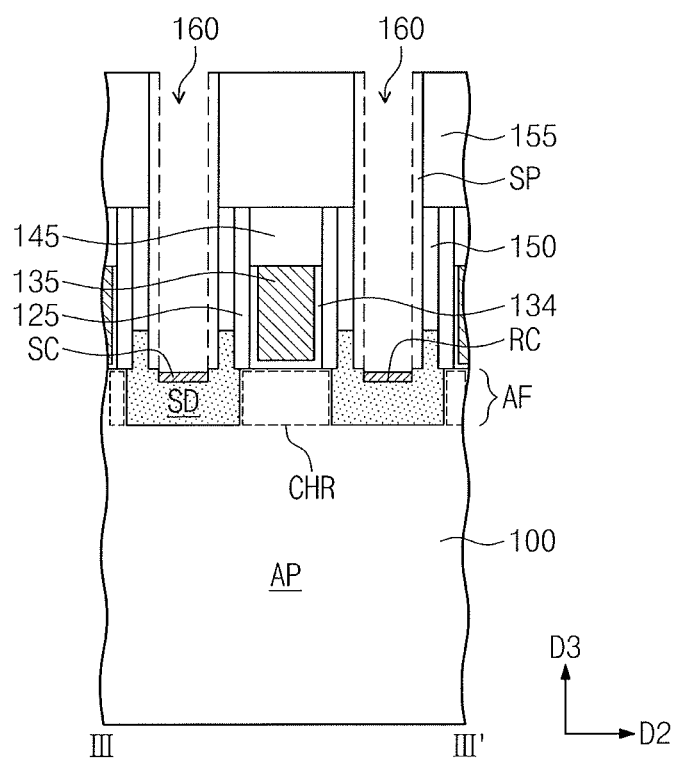

FIGS. 13A and 13B are sectional views illustrating a method of fabricating a semiconductor device, according to example embodiments. FIG. 13A is a sectional view illustrating vertical sections taken along lines I-I' and II-II' of FIG. 2. FIG. 13B is a sectional view taken along line of FIG. 2. In the following description, an element or step previously described with reference to FIGS. 5A through 12A and FIGS. 5B through 12B may be identified by a similar or identical reference number without repeating an overlapping description thereof, for the sake of brevity.

Referring to FIGS. 2, 13A, and 13B, an anisotropic etching process may be performed on the structure of FIGS. 11A and 11B. Accordingly, the spacers SP may be formed to cover the sidewalls of the contact holes 160. As a result of the anisotropic etching process, the upper regions of the source/drain regions SD may be over-etched to form expanded holes 165.

The metal silicide layer SC may be formed in a lower region of each of the recess regions RC. The formation of the metal silicide layers SC may include a strip process and a pre-cleaning process performed on the contact holes 160. For example, the strip process and the pre-cleaning process may be performed to completely remove the spacers SP from the contact holes 160. In this case, sidewalls of the recess regions RC may be exposed, after the formation of the metal silicide layers SC.

Referring back to FIGS. 2, 3A, 3B, and 4B, the contacts CA may be formed in the contact holes 160, respectively, to be in contact with the metal silicide layers SC. The lower sidewalls of the contacts CA may be in direct contact with the source/drain regions SD. A lower portion of each of the contacts CA may be formed to have a width decreasing in a direction toward the substrate 100.

In other example embodiments, the metal silicide layers SC may be formed to have an enlarged shape, as shown in FIG. 4E. The shape of the metal silicide layer SC may be variously changed depending on a kind of metal in use and a process condition of the thermal treatment step.

Figure 14A:
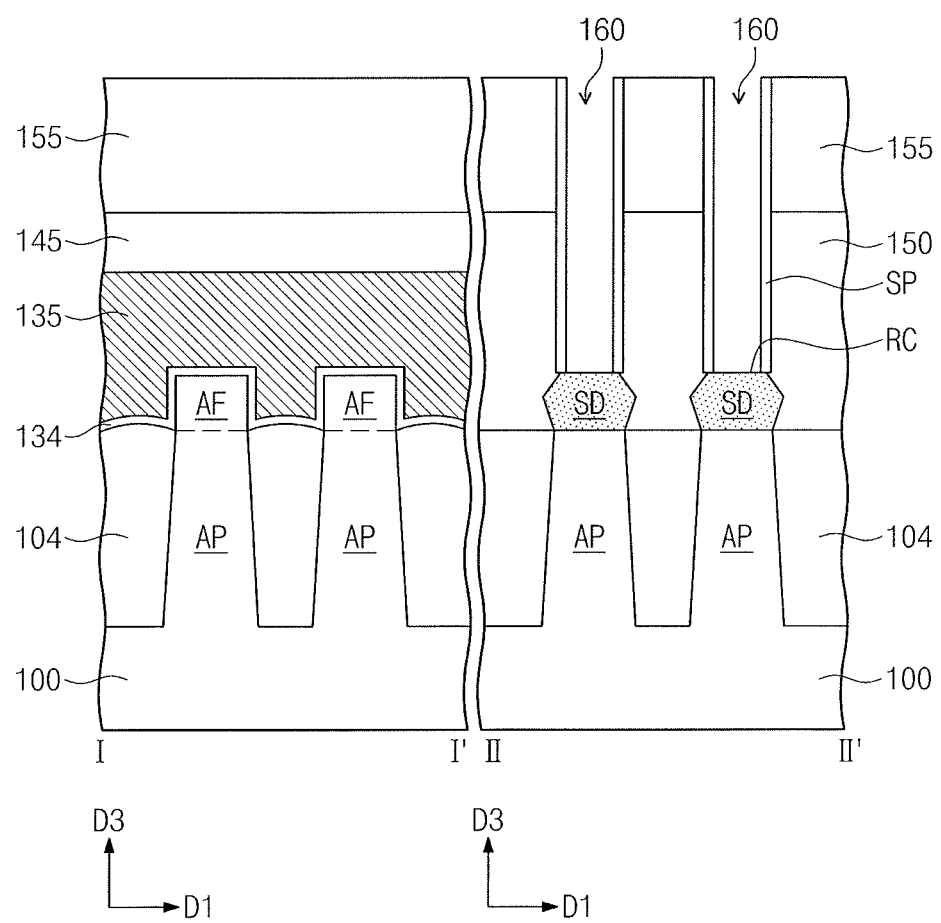
FIGS. 14A and 14B are sectional views illustrating a method of fabricating a semiconductor device, according to still other example embodiments.
Figure 14B:
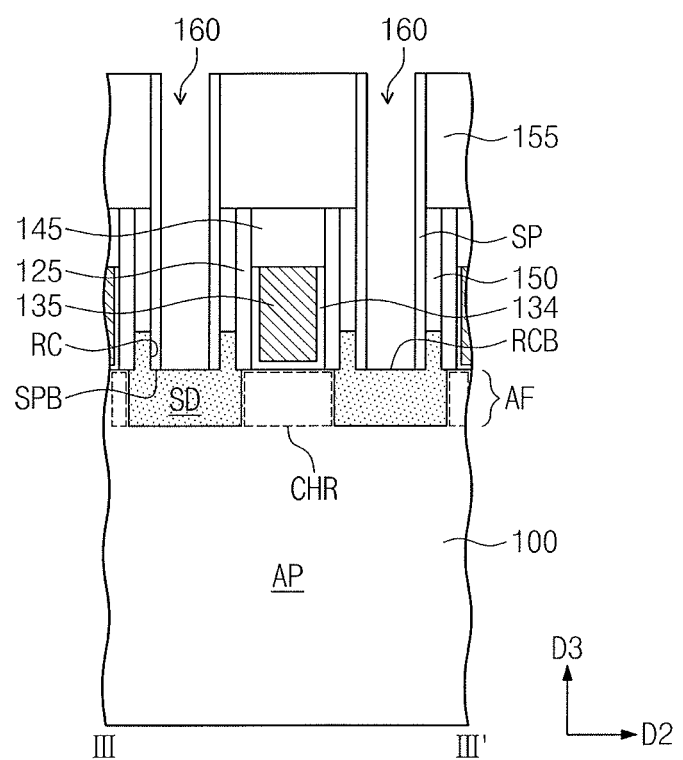

FIGS. 14A and 14B are sectional views illustrating a method of fabricating a semiconductor device, according to example embodiments. FIG. 14A is a sectional view illustrating vertical sections taken along lines I-I' and II-II' of FIG. 2. FIG. 14B is a sectional view taken along line of FIG. 2. In the following description, an element or step previously described with reference to FIGS. 5A through 12A and FIGS. 5B through 12B may be identified by a similar or identical reference number without repeating an overlapping description thereof, for the sake of brevity.

Referring to FIGS. 2, 14A, and 14B, an anisotropic etching process may be performed on the structure of FIGS. 11A and 11B. Accordingly, the spacers SP may be formed to cover the sidewalls of the contact holes 160. Here, the anisotropic etching process may be performed to expose the upper regions of the source/drain regions SD. For example, the bottom surfaces SPB of the spacers SP may be formed to be coplanar with the bottom surfaces RCB of the recess regions RC.

Referring back to FIGS. 2, 3A, 3B, and 4C, the metal silicide layer SC may be formed in a lower region of each of the recess regions RC. Thereafter, the contacts CA may be formed in the contact holes 160, respectively, to be in contact with the metal silicide layers SC. The bottom surfaces SPB of the spacers SP may be positioned at substantially the same level as the bottom surfaces CAB of the contacts CA.

In other example embodiments, the metal silicide layers SC may be formed to have an enlarged shape, as shown in FIG. 4F. The shape of the metal silicide layer SC may be variously changed depending on a kind of metal in use and a process condition of the thermal treatment step.

Figure 15:
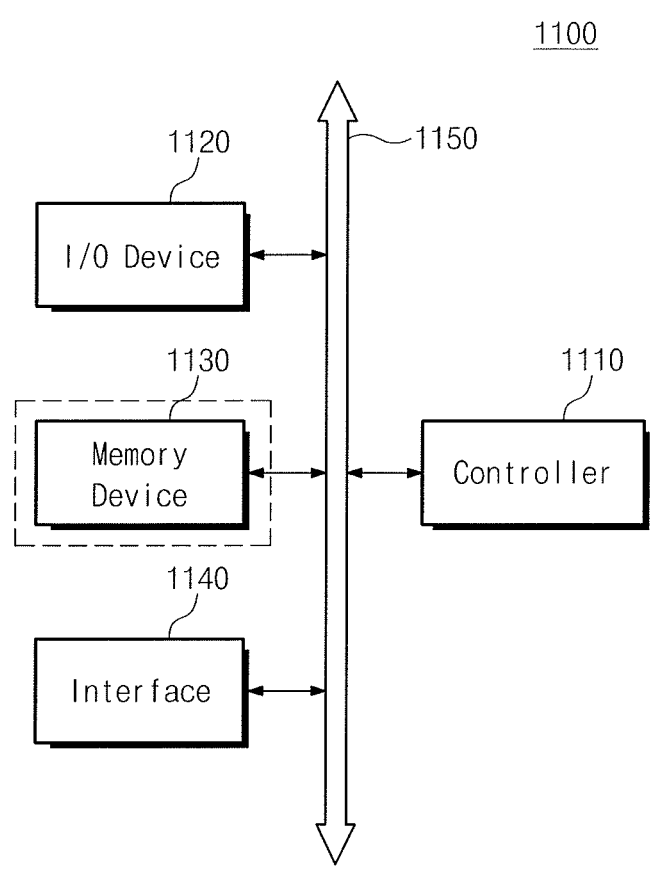
FIG. 15 is a block diagram illustrating an example of an electronic system including a semiconductor device according to example embodiments.

FIG. 15 is a block diagram illustrating an example of an electronic system including a semiconductor device according to example embodiments.

Referring to FIG. 15, an electronic system 1100 according to example embodiments may include a controller 1110, an input-output (I/O) unit 1120, a memory device 1130, an interface 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of, e.g., a microprocessor, a digital signal processor, a microcontroller, or another logic device, which is configured to have a similar function to them. The I/O unit 1120 may include, e.g., a keypad, a keyboard, or a display unit. The memory device 1130 may store data and/or commands. The memory device 1130 may include a nonvolatile memory device (e.g., a FLASH memory device, a phase-change memory device, a magnetic memory device, and so forth). Furthermore, the memory device 1130 may further include a volatile memory device. For example, the memory device 1130 may include a static random access memory (SRAM) device with the semiconductor device according to example embodiments. It may be possible to omit the memory device 1130, depending on the purpose of the electronic system 1100 or a type of an electronic product, for which the electronic system 1100 is used. The interface unit 1140 may transmit electrical data to a communication network or may receive electrical data from a communication network. The interface unit 1140 may operate in a wireless or wired manner. For example, the interface unit 1140 may include an antenna for the wireless communication or a transceiver for the wired and/or wireless communication. A semiconductor device according to example embodiments may be provided as a part of the controller 1110 or the I/O unit 1120. Although not shown in the drawings, the electronic system 1100 may further include a fast DRAM device and/or a fast SRAM device that acts as a cache memory for improving an operation of the controller 1110.

Figure 16:
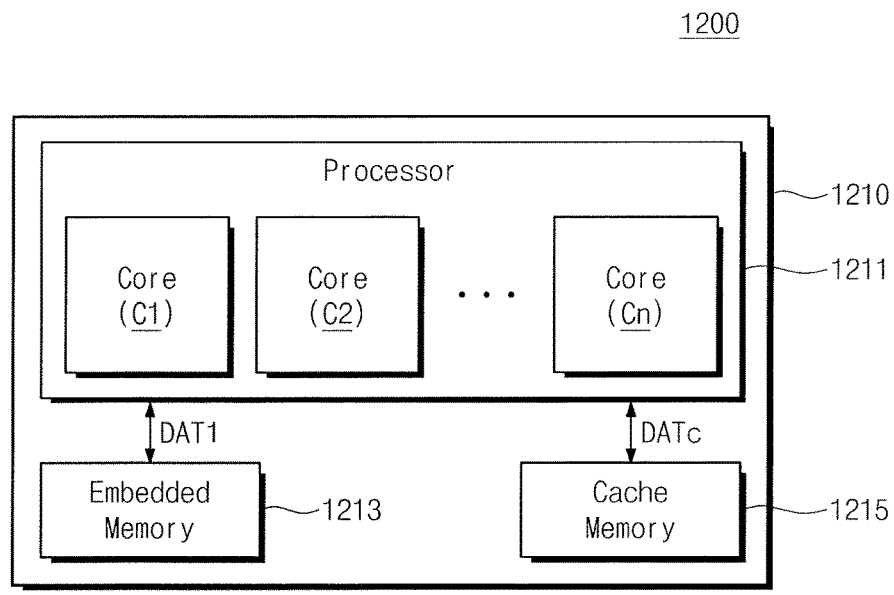
FIG. 16 is a block diagram illustrating an example of an electronic device including a semiconductor device according to example embodiments.

FIG. 16 is a block diagram illustrating an example of an electronic device including a semiconductor device according to example embodiments.

Referring to FIG. 16, an electronic device 1200 may include a semiconductor chip 1210. The semiconductor chip 1210 may include a processor 1211, an embedded memory 1213, and a cache memory 1215.

The processor 1211 may include one or more processor cores C1-Cn. The one or more processor cores C1-Cn may be configured to process data and signals. The processor cores C1-Cn may be configured to include the semiconductor device according to example embodiments, e.g., the plurality of logic cells described with reference to FIG. 1.

The electronic device 1200 may be configured to perform its own functions using the processed data and signals. As an example, the processor 1211 may be an application processor.

The embedded memory 1213 may exchange a first data DAT1 with the processor 1211. The first data DAT1 may be data processed, or to be processed, by the one or more processor cores C1-Cn. The embedded memory 1213 may manage the first data DAT1. For example, the embedded memory 1213 may be used for a buffering operation on first data DAT1. In other words, the embedded memory 1213 may be operated as a buffer memory or a working memory for the processor 1211.

In example embodiments, the electronic device 1200 may be used to realize a wearable electronic device. In general, the wearable electronic device may be configured to perform an operation of calculating a small amount of data, rather than calculating a large amount of data. In this sense, in the case where the electronic device 1200 is used for a wearable electronic device, the embedded memory 1213 may be configured to have a relatively small buffer capacity.

The embedded memory 1213 may be a static random access memory (SRAM) device. The SRAM device may have a faster operating speed than that of a dynamic random access memory (DRAM) device. Accordingly, in the case where the SRAM is embedded in the semiconductor chip 1210, it is possible for the electronic device 1200 to have a small size and a fast operating speed. Furthermore, in the case where the SRAM is embedded in the semiconductor chip 1210, it is possible to reduce an active power of the electronic device 1200. As an example, the SRAM may include at least one of the semiconductor devices according to example embodiments.

The cache memory 1215 may be mounted on the semiconductor chip 1210, along with the one or more processor cores C1-Cn. The cache memory 1215 may be configured to store cache data DATc that will be used or directly accessed by the one or more processor cores C1-Cn. The cache memory 1215 may be configured to have a relatively small capacity and a very fast operating speed. In example embodiments, the cache memory 1215 may include an SRAM device including the semiconductor device according to example embodiments. In the case where the cache memory 1215 is used, it is possible to reduce an access frequency or an access time to the embedded memory 1213 performed by the processor 1211. In other words, the use of the cache memory 1215 may allow the electronic device 1200 to have a fast operating speed.

To provide better understanding of example embodiments, the cache memory 1215 is illustrated in FIG. 16 to be a component separated from the processor 1211. However, the cache memory 1215 may be configured to be included in the processor 1211. In addition, example embodiments are not limited to the example illustrated by FIG. 16.

The processor 1211, the embedded memory 1213, and the cache memory 1215 may be configured to exchange or transmit data, based on at least one of various interface protocols. For example, the processor 1211, the embedded memory 1213, and the cache memory 1215 may be configured to exchange or transmit data, based on at least one of Universal Serial Bus (USB), Small Computer System Interface (SCSI), Peripheral Component Interconnect (PCI) Express, Advanced Technology Attachment (ATA), Parallel ATA (PATA), Serial ATA (SATA), Serial Attached SCSI (SAS), Integrated Drive Electronics (IDE), or Universal Flash Storage (UFS).

Figure 17:
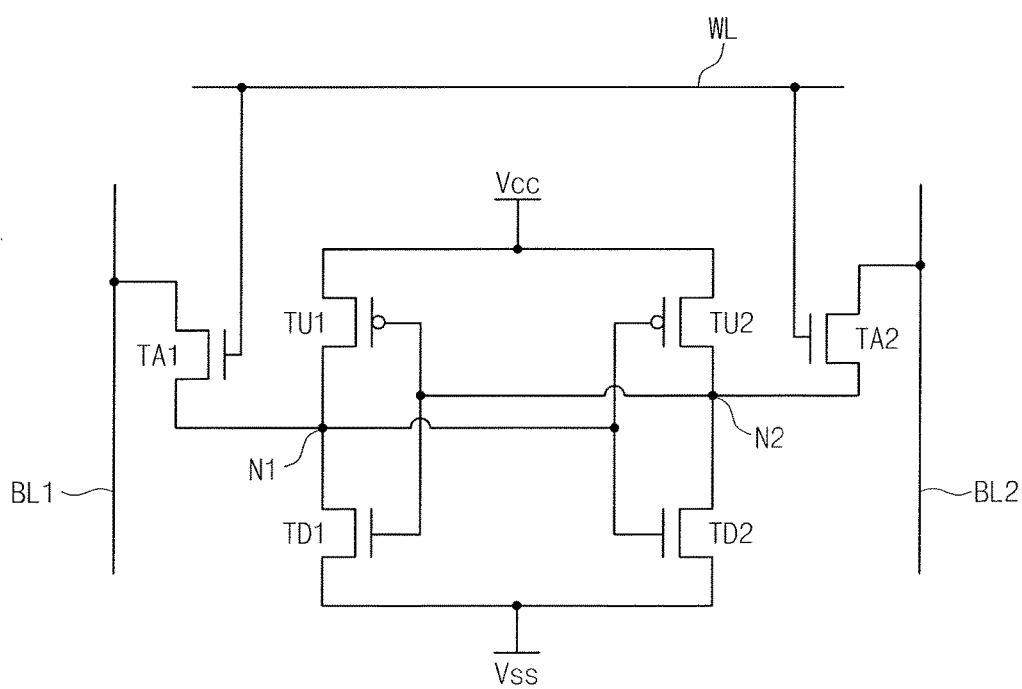
FIG. 17 is an equivalent circuit diagram illustrating an SRAM cell according to example embodiments.

FIG. 17 is an equivalent circuit diagram illustrating an SRAM cell according to example embodiments. The SRAM cell may be realized by at least one of the semiconductor devices according to example embodiments. The SRAM cell may be used for the embedded memory 1213 and/or the cache memory 1215 of FIG. 16.

Referring to FIG. 17, the SRAM cell may include a first pull-up transistor TU1, a first pull-down transistor TD1, a second pull-up transistor TU2, a second pull-down transistor TD2, a first access transistor TA1, and a second access transistor TA2. The first and second pull-up transistors TU1 and TU2 may be PMOS transistors, whereas the first and second pull-down transistors TD1 and TD2 and the first and second access transistors TA1 and TA2 may be NMOS transistors.

A first source/drain region of the first pull-up transistor TU1 and a first source/drain region of the first pull-down transistor TD1 may be connected to a first node N1. A second source/drain region of the first pull-up transistor TU1 may be connected to a power line Vcc, and a second source/drain region of the first pull-down transistor TD1 may be connected to a ground line Vss. A gate of the first pull-up transistor TU1 and a gate of the first pull-down transistor TD1 may be electrically connected to each other. Accordingly, the first pull-up transistor TU1 and the first pull-down transistor TD1 may constitute a first inverter. The mutually-connected gates of the first pull-up transistor TU1 and the first pull-down transistor TD1 may serve as an input terminal of the first inverter, and the first node N1 may serve as an output terminal of the first inverter.

A first source/drain region of the second pull-up transistor TU2 and a first source/drain region of the second pull-down transistor TD2 may be connected to the second node N2. A second source/drain region of the second pull-up transistor TU2 may be connected to the power line Vcc, and a second source/drain region of the second pull-down transistor TD2 may be connected to the ground line Vss. A gate of the second pull-up transistor TU2 and a gate of the second pull-down transistor TD2 may be electrically connected to each other. Accordingly, the second pull-up transistor TU2 and the second pull-down transistor TD2 may constitute a second inverter. The mutually-connected gates of the second pull-up transistor TU2 and the second pull-down transistor TD2 may serve as an input terminal of the second inverter, the second node N2 may serve as an output terminal of the second inverter.

The first and second inverters may be coupled with each other to form a latch structure. In other words, the gates of the first pull-up transistor TU1 and the first pull-down transistor TD1 may be electrically connected to the second node N2, and the gates of the second pull-up and second pull-down transistors TU2 and TD2 may be electrically connected to the first node N1. The first source/drain region of the first access transistor TA1 may be connected to the first node N1, and the second source/drain region of the first access transistor TA1 may be connected to a first bit line BL1. The first source/drain region of the second access transistor TA2 may be connected to the second node N2, and the second source/drain region of the second access transistor TA2 may be connected to a second bit line BL2. The gates of the first and second access transistors TA1 and TA2 may be electrically coupled to a word line WL. The SRAM cell according to example embodiments may have the aforedescribed structure, but example embodiments are not limited thereto.

Figure 18:
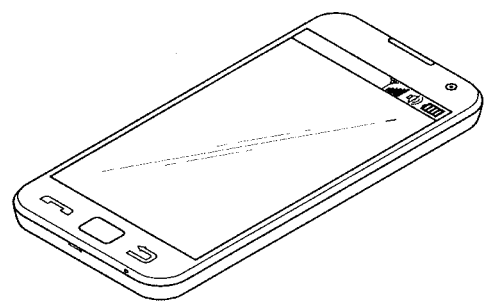
FIGS. 18 through 20 are diagrams illustrating some examples of a multimedia device including a semiconductor device according to example embodiments.
Figure 19:
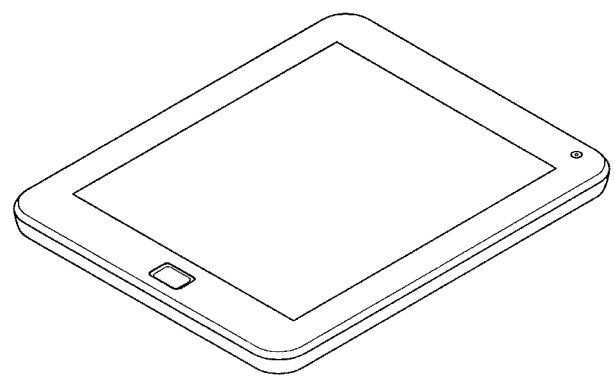
Figure 20:
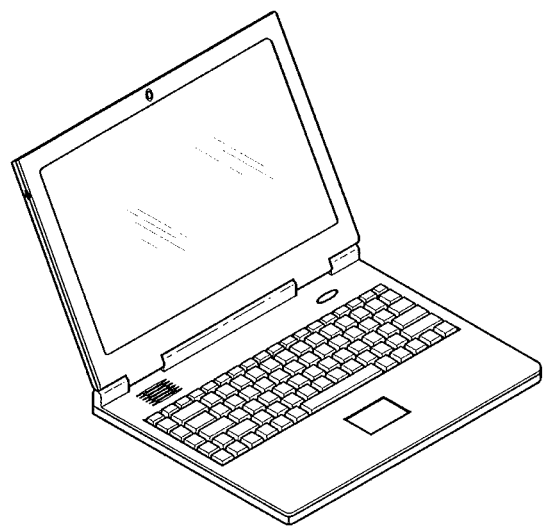

FIGS. 18 through 20 are diagrams illustrating some examples of a multimedia device including a semiconductor device according to example embodiments. The electronic system 1100 of FIG. 15 and/or the electronic device 1200 of FIG. 16 may be applied to a mobile or smart phone 2000 shown in FIG. 18, to a tablet or smart tablet PC 3000 shown in FIG. 19, or to a laptop computer 4000 shown in FIG. 20.

According to example embodiments, a semiconductor device may include a contact plug provided in a recess region of a source/drain region, and thus, it is possible to reduce electric resistance between the contact plug and the source/drain region. Furthermore, a spacer may be provided to enclose the contact plug to prevent a short circuit from being formed between the contact plug and a gate electrode. That is, during formation of the spacer, a contact hole may be further recessed to form a stepped recess region in an upper region of the source/drain epitaxial pattern to accommodate a silicide layer, thereby providing improved electrical connection between the contact plug and the source/drain region while electrically insulating the contact plug from the gate electrode.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate with an active pattern;
a gate electrode crossing the active pattern;

a source/drain region in an upper portion of the active pattern at a side of the gate electrode, the source/drain region including a recess region at an upper region thereof;

a contact electrically connected to the source/drain region, the contact including a lower portion in the recess region;

a metal silicide layer in a lower region of the recess region, the metal silicide layer being between the source/drain region and the contact; and a spacer in an upper region of the recess region, the spacer being between the source/drain region and the contact and spaced apart from the metal silicide layer, wherein a bottom of the spacer and the metal silicide layer have a non-overlapping relationship, wherein the bottom of the spacer is positioned at a lower level than a top of the source/drain region, and wherein the metal silicide layer and the spacer define an inner sidewall of the recess region, the inner sidewall having a staircase profile.

2. The device as claimed in claim 1, wherein the source/drain region has a top surface higher than a bottom surface of the contact.

3. The device as claimed in claim 1, wherein a bottom surface of the contact is spaced apart from a bottom surface of the recess region with the metal silicide layer therebetween.

4. The device as claimed in claim 1, wherein a bottom surface of the spacer is positioned at a higher level than a bottom surface of the contact.

5. The device as claimed in claim 1, wherein a bottom surface of the spacer is positioned at substantially the same level as a bottom surface of the contact.

6. The device as claimed in claim 1, wherein the metal silicide layer is in contact with a bottom surface of the contact and with a bottom surface of the spacer.

7. The device as claimed in claim 1, wherein the lower portion of the contact includes:

a first portion adjacent to an upper region of the recess region, and a second portion adjacent to the lower region of the recess region, the first portion having a width greater than that of the second portion.

8. The device as claimed in claim 1, wherein the contact includes a conductive pillar and a barrier layer enclosing the conductive pillar.

9. The device as claimed in claim 1, further comprising an interlayered insulating layer covering the active pattern, the source/drain region, and the gate electrode, wherein the contact is connected to the source/drain region through the interlayered insulating layer.

10. The device as claimed in claim 1, further comprising device isolation layers on the substrate to define the active pattern, the source/drain region and the upper portion of the active pattern protruding upwardly between the device isolation layers.

11. The device as claimed in claim 10, further comprising:

gate spacers on sidewalls of the gate electrode; and a gate dielectric layer between the gate electrode and the gate spacers, and between the gate electrode and the active pattern, wherein the gate spacers and the gate dielectric layer extend along the gate electrode.

12. A semiconductor device, comprising:

device isolation layers on a substrate to define an active pattern;

a gate electrode crossing the active pattern;

a source/drain region in an upper portion of the active pattern at a side of the gate electrode, the source/drain region including a recess region at an upper region thereof;

a contact electrically connected to the source/drain region, the contact including a lower portion in the recess region; and a metal silicide layer at a lower region of the recess region, the metal silicide layer being between the source/drain region and the contact, wherein, when viewed in a cross-sectional view along a direction perpendicular to a longitudinal direction of the gate electrode, an inner sidewall of the recess region has a staircase profile, a portion of the inner sidewall of the recess region directly contacting the contact and the metal silicide layer at a boundary between the contact and the metal silicide layer, and wherein at least a portion of the contact extends into a portion of the recess with a smallest width.

13. The device as claimed in claim 12, further comprising a spacer at an upper region of the recess region, the spacer being between the source/drain region and the contact, wherein the contact and the spacer are arranged to trace a same profile as the staircase profile of the recess region.

14. The device as claimed in claim 12, wherein the lower portion of the contact includes:

a first portion adjacent to an upper region of the recess region, and a second portion adjacent to a lower region of the recess region, the first portion and the second portion having a same profile as the staircase profile of the recess region.

15. A semiconductor device, comprising:

a substrate with an active pattern;

a source/drain region in a portion of the active pattern, the source/drain region defining a recess region at an upper region thereof;

a contact electrically connected to the source/drain region, the contact including a lower portion in the recess region; and a spacer covering a sidewall of the contact, the spacer including a lower portion between the source/drain region and the lower portion of the contact, a bottom surface of the spacer being positioned at a higher level than a bottom surface of the recess region and at a lower level than a top of the source/drain region, wherein the contact extends into the recess region beyond the bottom surface of the spacer, such that a bottom surface of the contact is positioned at a lower level than the bottom surface of the spacer.

16. The device as claimed in claim 15, further comprising an interlayered insulating layer covering the active pattern and the source/drain region, the contact penetrating the interlayered insulating layer, and an upper portion of the spacer being between the interlayered insulating layer and an upper portion of the contact.

17. The device as claimed in claim 15, wherein a width of a portion of the recess region contacting a bottom of the spacer is larger than a width of a lowermost surface of the recess region.

18. The device as claimed in claim 15, further comprising a metal silicide layer on a bottom of the recess, the contact extending into the metal silicide layer.

* * * * *